(12) United States Patent
Choi et al.

(10) Patent No.: US 10,991,914 B2
(45) Date of Patent: Apr. 27, 2021

(54) LIGHT EMITTING DISPLAY DEVICE

(71) Applicant: LG Display Co., Ltd., Seoul (KR)

(72) Inventors: Yonghoon Choi, Paju-si (KR); Jintae Kim, Paju-si (KR); Dongmin Sim, Paju-si (KR); KangJu Lee, Paju-si (KR); Sookang Kim, Paju-si (KR); Taeshick Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/453,070

(22) Filed: Jun. 26, 2019

(65) Prior Publication Data

US 2019/0393448 A1    Dec. 26, 2019

(30) Foreign Application Priority Data

Jun. 26, 2018  (KR) .................. 10-2018-0073482
Dec. 19, 2018  (KR) .................. 10-2018-0165519

(51) Int. Cl.
*H01L 51/52*    (2006.01)
*H01L 27/32*    (2006.01)
*H01L 51/50*    (2006.01)

(52) U.S. Cl.
CPC ...... *H01L 51/5271* (2013.01); *H01L 27/3258* (2013.01); *H01L 51/5012* (2013.01); *H01L 51/5209* (2013.01); *H01L 51/5225* (2013.01); *H01L 27/322* (2013.01); *H01L 27/3213* (2013.01)

(58) Field of Classification Search
CPC ............ H01L 51/5271; H01L 27/3258; H01L 51/5209; H01L 51/5225; H01L 51/5012; H01L 27/322; H01L 27/3213
See application file for complete search history.

(56) References Cited

U.S. PATENT DOCUMENTS

| 2017/0084676 A1* | 3/2017 | Jang ................... H01L 51/5275 |
| 2017/0125738 A1* | 5/2017 | Kim .................... H01L 51/5225 |
| 2018/0090717 A1* | 3/2018 | Lim .................... H01L 51/5275 |
| 2018/0175327 A1 | 6/2018 | Jang et al. |
| 2019/0198793 A1 | 6/2019 | Guo |

FOREIGN PATENT DOCUMENTS

| CN | 107316949 A | 11/2017 |
| KR | 10-2014-0133747 A | 11/2014 |
| KR | 1020160080834 A | 7/2016 |

* cited by examiner

*Primary Examiner* — Dung A. Le
(74) *Attorney, Agent, or Firm* — Seed IP Law Group LLP

(57) ABSTRACT

Disclosed is a light emitting display device that can enhance light extraction efficiency of light which is emitted from a light emitting element. The light emitting display device includes an overcoating layer on a substrate and including a plurality of protruding portions, a first electrode on the plurality of protruding portions, a light emitting layer on the first electrode, and a second electrode on the light emitting layer. The first electrode has a contour which conforms to contour of the plurality of protruding portions. The light emitting layer has a contour different from the contours of the plurality of protruding portions.

22 Claims, 15 Drawing Sheets

LIGHT EMITTING DISPLAY DEVICE

CROSS-REFERENCE TO RELATED APPLICATIONS

This application claims the benefit of and priority to Korean Patent Application No. 10-2018-0073482, filed Jun. 26, 2018, and Korean Patent Application No. 10-2018-0165519, filed Dec. 19, 2018, each of which applications are hereby incorporated by reference in their entireties as if fully set forth herein.

BACKGROUND

Technical Field

The present disclosure relates to a light emitting display device.

Description of the Related Art

Since a light emitting display device has a high response speed and low power consumption and spontaneously emits light without using a particular light source unlike a liquid crystal display device, the light emitting display device does not cause a problem in a viewing angle and thus attracts attention as a next-generation flat panel display device.

A light emitting display device displays an image through emission of light from light emitting elements, each of which includes a light emitting layer interposed between two electrodes. In this case, light which is generated based on emission of light from the light emitting elements is externally discharged via the electrodes, a substrate, and the like.

However, in such a light emitting display device, some of the light emitted from a light emitting layer is not externally discharged due to total reflection or the like at an interface between the light emitting layer and an electrode and/or an interface between the substrate and an air layer and thus light extraction efficiency decreases. Accordingly, a light emitting display device has a problem in that luminance decreases and power consumption increases due to low light extraction efficiency.

BRIEF SUMMARY

In various embodiments, the present disclosure provides a light emitting display device that can enhance light extraction efficiency of light which is emitted from a light emitting element.

In one or more embodiments, the present disclosure provides a light emitting display device including an overcoating layer on a substrate and including a plurality of protruding portions, a first electrode on the plurality of protruding portions, a light emitting layer on the first electrode, and a second electrode on the light emitting layer, wherein the first electrode has a contour which conforms to contours of the plurality of protruding portions and the light emitting layer has a contour which does not conform to the contours of the plurality of protruding portions.

According to another embodiment of the present disclosure, there is provided a light emitting display device including an overcoating layer on a substrate and including an uneven portion having a plurality of protruding portions, a first electrode on the uneven portion, a light emitting layer on the first electrode, and a second electrode on the light emitting layer, wherein the uneven portion has a surface area increase rate within a range of 1.05 to 2.0, inclusive, with respect to a unit area.

According to another embodiment of the present disclosure, there is provided a light emitting display device including a substrate including a plurality of pixels having an opening area, an overcoating layer on the substrate and including an uneven portion having a plurality of apex portions in the opening area, a first electrode on the uneven portion, a light emitting layer on the first electrode, and a second electrode on the light emitting layer, wherein the first electrode is formed in a conformal shape with respect to the uneven portion and the light emitting layer is formed in a non-conformal shape with respect to the first electrode.

According to another embodiment of the present disclosure, there is provided a light emitting display device including an overcoating layer on a substrate and including a plurality of protruding portions, a first electrode on the plurality of protruding portions, a light emitting layer on the first electrode, and a second electrode on the light emitting layer, wherein a half-height aspect ratio at a half height of a total height from a bottom portion to a top portion of each of the plurality of protruding portions is within a range from 0.45 to 0.7, inclusive, and a 4/5 height aspect ratio at 4/5 of the total height is within a range from 0.35 to 0.6, inclusive.

With the light emitting display device according to various embodiments of the present disclosure, it is possible to enhance light extraction efficiency of light which is emitted from a light emitting element, to improve luminance, and to decrease power consumption.

In addition to the above-mentioned advantageous effects of the present disclosure, other features and advantages of the present disclosure will be described or can be clearly understood by those skilled in the art from such description or explanation.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
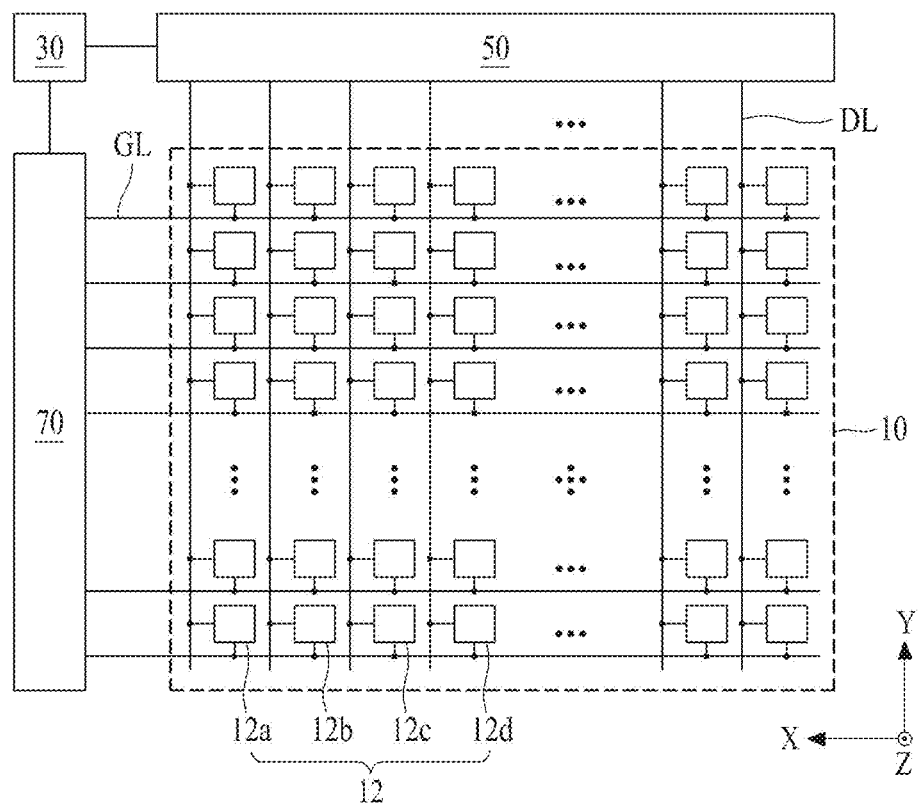
FIG. 1 is a diagram schematically illustrating a light emitting display device according to the present disclosure.

Reference will now be made in detail to the exemplary embodiments of the present disclosure, examples of which are illustrated in the accompanying drawings. Wherever possible or convenient for description of embodiments provided herein, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where "comprise," "have," and "include" described in the present specification are used, another part may be added unless "only~" is used. The terms of a singular form may include plural forms unless specifically limited to the contrary.

In construing an element, the element is to be construed as including an error range although there is no explicit description.

In describing a positional relationship between elements, for example, when a positional relation between two parts is described as "on~," "over~," "under~," and "next~," one or more other parts may be disposed between the two parts unless "just" or "direct" is used.

In describing a time relationship, for example, when the temporal order is described as "after~," "subsequent~," "next~," and "before~," a case which is not continuous may be included unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of a light emitting display device according to the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

FIG. 1 is a diagram schematically illustrating a light emitting display device according to one or more embodiments of the present disclosure.

Referring to FIG. 1, a light emitting display device according to embodiments of the present disclosure includes a pixel array unit 10, a control circuit 30, a data driving circuit 50, and a gate driving circuit 70.

The pixel array unit 10 includes a plurality of gate lines GL and a plurality of data lines DL which are provided on a substrate and a plurality of pixels 12a, 12b, 12c, and 12d that are formed in pixel areas which are defined by the plurality of gate lines GL and the plurality of data lines DL.

Each of the plurality of pixels 12a, 12b, 12c, and 12d displays an image in accordance with a gate signal which is supplied from the adjacent gate line GL and a data signal which is supplied from the adjacent data line DL.

For example, each of the plurality of pixels 12a, 12b, 12c, and 12d includes a pixel circuit that is provided in the corresponding pixel area and a light emitting element that is connected to the pixel circuit.

The pixel circuit includes at least two thin-film transistors and at least one capacitor.

The light emitting element includes a spontaneous light emitting element that emits light in response to a data signal which is supplied from the pixel circuit and displays an image. Examples of the spontaneous light emitting element include an organic light emitting element, a quantum-dot light emitting element, and an inorganic light emitting element.

Each of the plurality of pixels 12a, 12b, 12c, and 12d can be defined of an area of a minimum unit from which light is actually emitted and can be referred to as a subpixel. In some embodiments, at least three pixels adjacent to each other can constitute a unit pixel 12 for displaying a color image.

One unit pixel 12 according to an embodiment may include three pixels 12a, 12b, and 12c that are arranged adjacent in the longitudinal direction of the corresponding gate line GL or include four pixels 12a, 12b, 12c, and 12d that are arranged adjacent to each other in the longitudinal direction of the corresponding gate line GL. For example, a first pixel 12a may be a red pixel, a second pixel 12b may be a green pixel, a third pixel 12c may be a blue pixel, and a fourth pixel 12d may be a white pixel. The light emitting elements of the first to third pixels 12a, 12b, and 12c may emit light of different colors or may emit white light. When the light emitting elements of the first to third pixels 12a, 12b, and 12c emit white light, the first to third pixels 12a, 12b, and 12c includes different wavelength conversion layers (or color filter layers) that convert white light into light of different colors. The light emitting element of the fourth pixel 12d may emit white light. In some embodiments, the fourth pixel 12d may not include a wavelength conversion layer (or a color filter layer) or may include the same wavelength conversion layer (or a color filter layer) as one of the first to third pixels 12a, 12b, and 12c.

One unit pixel 12 according to another embodiment may include first to fourth pixels 12a, 12b, 12c, and 12d that are arranged adjacent to each other in the longitudinal direction of the corresponding data line DL. In such a unit pixel 12, the number of gate lines GL connected to the gate driver circuit 70 having a relatively simple circuit configuration increases but the number of data lines DL connected to the data driver circuit 50 having a relatively complicated circuit configuration decreases.

The control circuit 30 generates pixel data corresponding to a plurality of pixels 12a, 12b, 12c, and 12d on the basis of an image signal. The control circuit 30 according to an embodiment of the present disclosure may extract white pixel data on the basis of an image signal, that is, red input data, green input data, and blue input data of the unit pixel 12, calculate red pixel data, green pixel data, and blue pixel data by reflecting offset data based on the extracted white pixel data in the red input data, the green input data, and the blue input data, arranges the calculated red pixel data, green pixel data, and blue pixel data and the white pixel data to correspond to a pixel array structure, and supply the arranged data to the data driver circuit 50.

The control circuit 30 generates a data control signal on the basis of a timing synchronization signal and supplies the generated data control signal to the data driver circuit 50. The control circuit 30 generates a gate control signal on the basis of a timing synchronization signal and supplies the generated gate control signal to the gate driver circuit 70.

The data driver circuit 50 is connected to a plurality of data lines DL which are provided in the pixel array unit 10. The data driver circuit 50 receives pixel data and the data control signal which is supplied from the control circuit 30 and receives a plurality of reference gamma voltages which are supplied from a power supply circuit. The data driver circuit 50 converts the pixel data into a pixel data signal using the data control signal and the plurality of reference gamma voltages and supplies the converted pixel data signal to the corresponding data lines DL.

The gate driver circuit 70 is connected to a plurality of gate lines GL which are provided in the pixel array unit 10. The gate driver circuit 70 generates a gate signal in a predetermined sequence on the basis of the gate control signal which is supplied from the control circuit 30 and supplies the generated gate signal to the corresponding gate lines GL.

The gate driver circuit 70 according to an embodiment may be integrated on one edge or both edges of the substrate through a process of manufacturing a thin-film transistor and may be connected to the plurality of gate lines GL in a one-to-one correspondence manner. The gate driver circuit 70 according to another embodiment may be configured as an integrated circuit and mounted on the substrate or may be mounted on a soft circuit film and connected to the plurality of gate lines GL in a one-to-one correspondence manner.

Figure 2:
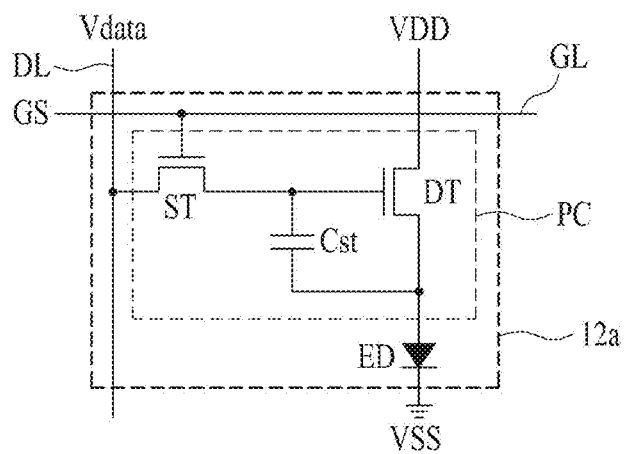
FIG. 2 is a circuit diagram illustrating a first pixel illustrated in FIG. 1.

FIG. 2 is an equivalent circuit diagram illustrating the first pixel illustrated in FIG. 1.

Referring to FIG. 2, the first pixel 12a of the light emitting display device according to an embodiment includes a pixel circuit PC and a light emitting element ED.

The pixel circuit PC is provided in a circuit area in a pixel area which is defined by the corresponding gate line GL and the corresponding data line DL and is connected to the corresponding gate line GL, the corresponding data line DL, and a first driving power supply VDD. The pixel circuit PC controls emission of light from the light emitting element ED in accordance with a data signal Vdata from the data line DL in response to a gate-on signal GS from the gate line GL. For example, the pixel circuit PC according to an embodiment may include a switching thin-film transistor ST, a driving thin-film transistor DT, and a capacitor Cst.

The switching thin-film transistor ST may include a gate electrode that is connected to the corresponding gate line GL, a first source/drain electrode that is connected to the corresponding data line DL, and a second source/drain electrode that is connected to the gate electrode of the driving thin-film transistor DT. The switching thin-film transistor ST is turned on in accordance with a gate-on signal GS supplied to the gate line GL and supplies the data signal Vdata supplied to the data line DL to the gate electrode of the driving thin-film transistor DT.

The driving thin-film transistor DT may include a gate electrode that is connected to the second source/drain electrode of the switching thin-film transistor ST, a drain electrode that is connected to the first driving power supply VDD, and a source electrode that is connected to the light emitting element ED. The driving thin-film transistor DT is turned on in accordance with the data signal Vdata supplied from the switching thin-film transistor ST and controls a current (or a data current) which is supplied from the first driving power supply VDD to the light emitting element ED.

The capacitor Cst is connected between the gate electrode and the source electrode of the driving thin-film transistor DT, stores a voltage corresponding to the data signal Vdata supplied to the gate electrode of the driving thin-film transistor DT, and turns on the driving thin-film transistor DT with the stored voltage. The capacitor Cst can maintain the turned-on state of the driving thin-film transistor DT until a new data signal Vdata is supplied via the switching thin-film transistor ST in a next frame.

The light emitting element ED is provided in an emission area in the pixel area and emits light in accordance with a current supplied from the pixel circuit PC.

For example, the light emitting element ED may include a first electrode that is connected to the source electrode of the driving thin-film transistor DT, a second electrode that is connected to a second driving power supply VSS, and a light emitting layer that is provided between the first electrode and the second electrode. The light emitting layer may include one of an organic light emitting layer, an inorganic light emitting layer, and a quantum-dot light emitting layer or it may include a stacked or mixed structure of an organic light emitting layer (or an inorganic light emitting layer) and a quantum-dot light emitting layer.

The first pixel 12a of the light emitting display device according to an embodiment displays a predetermined image by causing the light emitting element ED to emit light in accordance with a current corresponding to a data signal Vdata.

Similarly, the second to fourth pixels 12b, 12c, and 12d have substantially the same configuration as the first pixel 12a and thus, its repetitive description is omitted.

Figure 3:
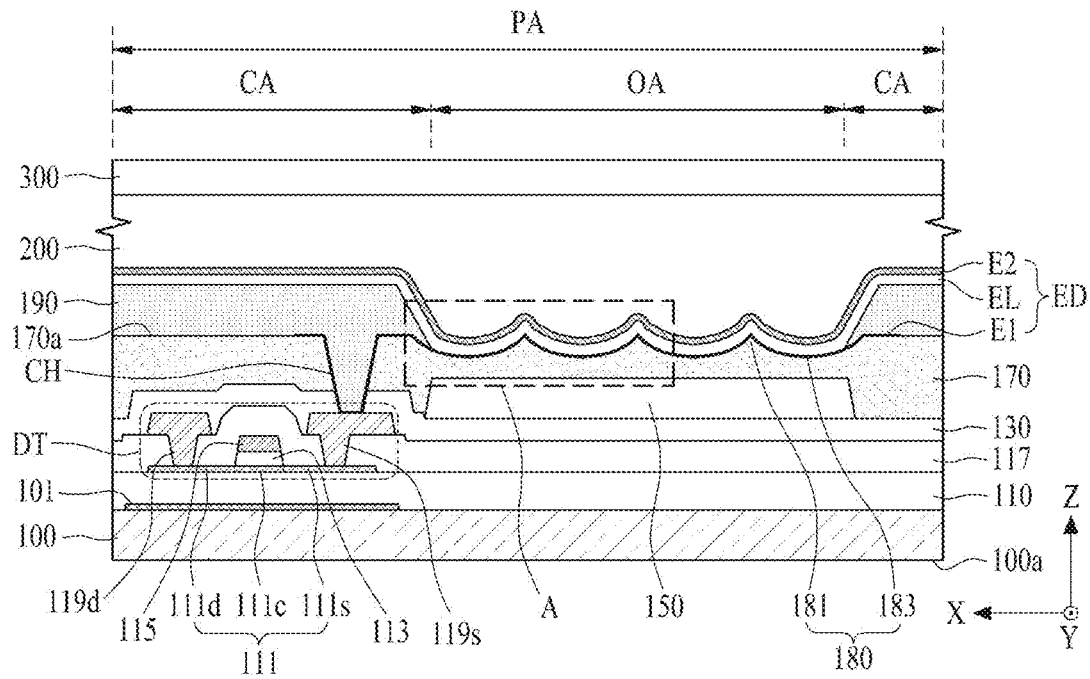
FIG. 3 is a sectional view illustrating a pixel according to an example of the present disclosure.
Figure 4:
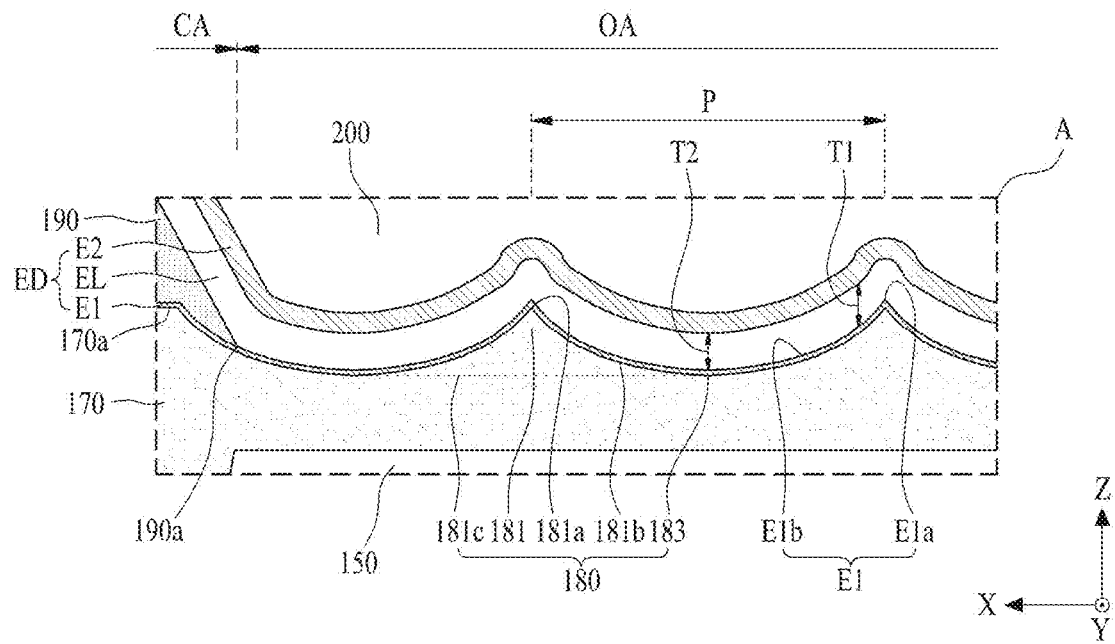
FIG. 4 is an enlarged view of part A illustrated in FIG. 3.
Figure 5:
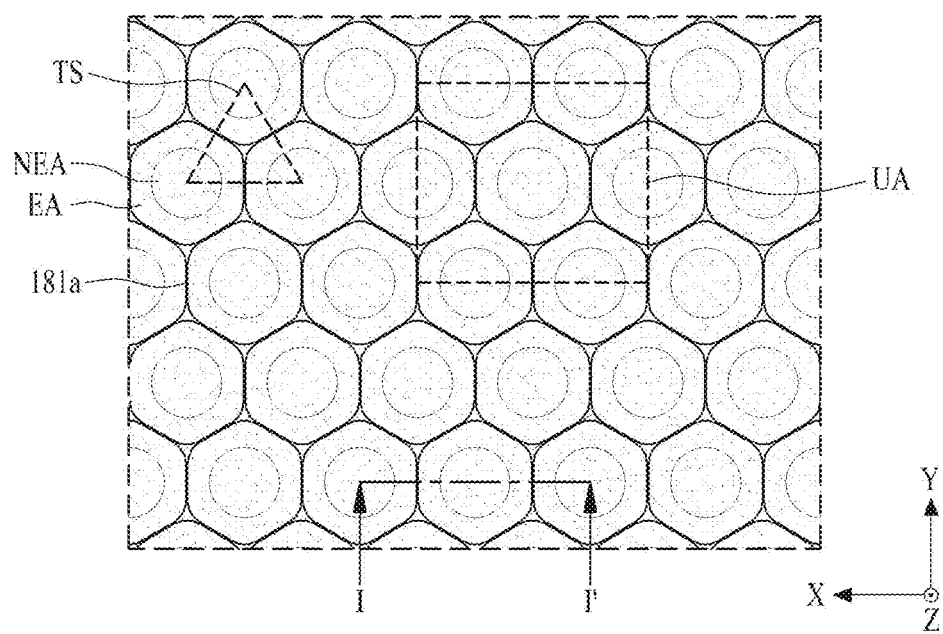
FIG. 5 is a plan view illustrating a planar structure of an uneven portion illustrated in FIG. 3.

FIG. 3 is a sectional view illustrating a pixel according to an embodiment of the present disclosure. FIG. 4 is an enlarged view of part A illustrated in FIG. 3. FIG. 5 is a plan view illustrating a planar structure of an uneven portion illustrated in FIG. 3.

Referring to FIGS. 3 to 5, a pixel according to an embodiment of the present disclosure includes a substrate 100 and a pixel area PA that is provided on the substrate 100.

The substrate 100 may be formed of a glass material, but in various embodiments the substrate 100 may be formed of a transparent plastic material such as polyimide that can be bent or curved. When a plastic material is used as the material of the substrate 100, a high-temperature deposition process is performed on the substrate 100 and thus polyimide having excellent heat resistance that can stand at a high temperature can be used. The overall front surface of the substrate 100 can be covered with one or more buffer layer 110.

The buffer layer 110 serves to prevent materials included in the substrate 100 from diffusing into a transistor layer in a high-temperature process of the process of manufacturing a thin-film transistor. The buffer layer 110 can also serve to prevent external water or moisture from invading into the light emitting element. The buffer layer 110 may be formed of silicon oxide or silicon nitride. The buffer layer 110 may be omitted in some embodiments.

The pixel area PA includes a circuit area CA and an opening area OA.

The circuit area CA includes a transistor layer, a protective layer 130, and an overcoating layer 170.

The transistor layer may include a driving thin-film transistor DT.

For example, the driving thin-film transistor DT includes an active layer 111, a gate insulating film 113, a gate electrode 115, an interlayer insulating film 117, a drain electrode 119d, and a source electrode 119s.

The active layer 111 includes a channel region 111c, a drain region 111d, and a source region 111s that are formed in a driving thin-film transistor area of the circuit area CA defined on the buffer layer 110. For example, the active layer 111 includes the drain region 111d and the source region 111s which may be solidified by an etching gas at the time of etching of the gate insulating film 113 and the channel region 111c that is not solidified by the etching gas. The drain region 111d and the source region 111s can be separated to be parallel to each other with the channel region 111c interposed therebetween.

The active layer 111 according to an embodiment may be formed of a semiconductor material including one of amorphous silicon, polycrystalline silicon, an oxide, and an organic material, but embodiments are not limited thereto. For example, the active layer 111 according to the present disclosure may be formed of an oxide such as a Zinc Oxide, a Tin Oxide, a Ga—In—Zn Oxide, an In—Zn Oxide, or an In—Sn Oxide or may be formed of an oxide which is doped with ions of Al, Ni, Cu, Ta, Mo, Zr, V, Hf, or Ti.

The gate insulating film 113 is formed on a channel region 111c of the active layer 111. The gate insulating film 113 is not formed on the entire front surface of the substrate 100 including the active layer 111 or the buffer layer 110 but may be formed in the form of islands on only the channel regions 111c of the active layer 111.

The gate electrode 115 is formed on the gate insulating film 113 to overlap the channel region 111c of the active layer 111. The gate electrode 115 may serve as a mask for preventing the channel region 111c of the active layer 111 from being solidified by an etching gas at the time of patterning of the gate insulating film 113 using an etching process. The gate electrode 115 can be formed of molybdenum Mo, aluminum Al, chromium Cr, gold Au, titanium Ti, nickel Ni, neodymium Nd, copper Cu, or an alloy thereof and can be formed as a single layer of the metal or alloy or multiple layers including two or more layers.

The interlayer insulating film 117 is formed on the gate electrode 115 and the drain region 111d and the source region 111s of the active layer 111. For example, the interlayer insulating film 117 may be formed on the entire front surface of the substrate 100 or the buffer layer 110 to cover the gate electrode 115 and the drain region 111d and the source region 111s of the active layer 111. The interlayer insulating film 117 can be formed of an inorganic material such as a silicon oxide SiOx or a silicon nitride SiNx or can be formed of an organic material such as benzocyclobutene or photo acryl.

The drain electrode 119d is electrically connected to the drain region 111d of the active layer 111 via a first contact hole which is formed in the interlayer insulating film 117 overlapping the drain region 111d of the active layer 111.

The source electrode 119s is electrically connected to the source region 111s of the active layer 111 via a second contact hole which is formed in the interlayer insulating film 117 overlapping the source region 111s of the active layer 111.

The drain electrode 119d and the source electrode 119s may be formed of the same metal material such as molybdenum Mo, aluminum Al, chromium Cr, gold Au, titanium Ti, nickel Ni, neodymium Nd, copper Cu, or an alloy thereof and can be formed as a single layer of the metal or alloy or multiple layers including two or more layers.

In addition, the circuit area CA further includes a switching thin-film transistor and a capacitor.

The switching thin-film transistor is provided on the circuit area CA to have substantially the same structure as the driving thin-film transistor and thus description thereof will not be repeated.

The capacitor is provided in an overlap area of the gate electrode 115 and the source electrode 119s of the driving thin-film transistor DT with the interlayer insulating film 117 interposed therebetween.

In addition, a transistor which is provided in the circuit area CA may have characteristics that a threshold voltage thereof is shifted by light. In order to prevent this phenomenon, the light emitting display device according to the present disclosure may further include a light blocking layer 101 that is provided below the active layer 111.

The light blocking layer 101 is provided between the substrate 100 and the active layer 111 and serves to minimize or prevent change in a threshold voltage of the transistor due to external light by blocking light which is incident on the active layer 111 via the substrate 100. The light blocking layer 101 can be covered with the buffer layer 110. In some embodiments, the light blocking layer 101 may be electrically connected to the source electrode of the transistor or may be electrically connected to a separate bias power supply and may also serve as a lower gate electrode of the corresponding transistor. In some embodiments, the light blocking layer 101 minimizes or prevents change in characteristics due to light or change in a threshold voltage of the transistor due to a bias voltage.

The protective layer 130 is provided on the substrate 100 to cover the transistor layer. For example, the protective layer 130 may cover the drain electrode 119d and the source electrode 119s of the driving thin-film transistor DT and the interlayer insulating film 117. For example, the protective layer 130 can be formed of an inorganic material such as silicon oxide SiOx or silicon nitride SiNx. The protective layer 130 may be referred to as a passivation layer.

The overcoating layer 170 is provided on the substrate 100 to cover the protective layer 130. The overcoating layer 170 is formed in a relatively large thickness and serves to provide a flat surface on the substrate 100. For example, the overcoating layer 170 can be formed of an organic material such as photo acryl, benzocyclobutene, polyimide, or a fluorine resin.

The opening area OA can be defined as a light extraction area from which light generated in each pixel is extracted (or discharged) to the outside. For example, the opening area OA includes an uneven portion 180 and a light emitting element ED.

The uneven portion 180 (or a non-planar portion) is provided in the overcoating layer 170 overlapping the opening area OA to have an undulated (or uneven) shape and changes a propagation path of light emitted from the light emitting element ED to increase light extraction efficiency.

The uneven portion 180 according to an embodiment may include a plurality of protruding portions 181. Each of the plurality of protruding portions 181 can be referred to as a microlens.

Each of the plurality of protruding portions 181 may be provided in the overcoating layer 170 overlapping the opening area OA to have a shape which can increase or maximize external extraction efficiency of light which is generated in the pixel on the basis of the effective emission area of the light emitting element ED. Each of the plurality of protruding portions 181 changes a propagation path of light emitted from the light emitting element ED toward the substrate 100 to increase the external extraction efficiency of light emitted from the light emitting element ED.

Each of the plurality of protruding portions 181 according to an embodiment may have a sectional shape including a top portion 181a having a sharp or pointed shape. For example, each of the plurality of protruding portions 181 includes a first curved portion 181b with a recessed shape that is provided between a bottom portion 181c and the top portion 181a and can have a triangular section with the first curved portion 181b as a hypotenuse.

The top portion 181a of each of the plurality of protruding portions 181 may be referred to as a first apex portion with a sharp tip. Accordingly, the uneven portion 180 includes a plurality of apex portions and the apex portions can have a hexagonal shape in a plan view (or two-dimensionally). For example, the uneven portion 180 can have a honeycomb structure two-dimensionally.

The plurality of protruding portions 181 can be connected to each other in all directions. That is, the bottom portion (or the bottom surface) 181c of each of the plurality of protruding portions 181 can be connected to the bottom portions 181c of the protruding portions 181 adjacent thereto in all directions. Accordingly, the overcoating layer 170 (or the uneven portion 180) overlapping the opening area OA can include a plurality of concave portions 183 that are arranged between the plurality of protruding portions 181. One concave portion 183 is surrounded with a plurality of protruding portions 181 adjacent thereto. The plurality of protruding portions 181 surrounding one concave portion 183 can be arranged in a hexagonal shape (or a honeycomb structure). The plurality of protruding portions 181 and the plurality of concave portions 183 can be referred to as the uneven portion 180 or a microlens array including a top portion 181a.

Each of the plurality of concave portions 183 is provided to be concave from a front surface 170a (or a surface) of the overcoating layer 170. In some embodiments, the plurality of concave portions 183 have the same depth from the front surface 170a of the overcoating layer 170, but may have different depths within a fabrication error (or fabrication margin) range. For example, in some embodiments, a fabrication error range between the depths of the concave portions 183 may be less than about 10%, and in some embodiments, the fabrication error range may be less than about 5%. The plurality of concave portions 183 are arranged in a first direction X at substantially constant intervals and are arranged in zigzag in a second direction Y. For example, the plurality of concave portions 183 may be arranged in a lattice shape with constant intervals such that adjacent concave portions 183 are arranged in zigzag in the second direction Y. Accordingly, the centers of three adjacent concave portions 183 form a triangle TS. Each of the plurality of concave portions 183 is surrounded with six concave portions 183 which are disposed in the vicinity thereof. The centers of the six concave portions 183 surrounding one concave portion 183 form a hexagonal shape in a plan view.

The plurality of protruding portions 181 are defined as boundary portions between the concave portions 183. Accordingly, each of the plurality of concave portions 183 includes a first curved portion 181*b* which is surrounded with the boundary portions and provided to be concave from the boundary portions.

The uneven portion 180 including the plurality of protruding portions 181 and the plurality of concave portions 183 is formed by forming a mask pattern on the open area OA of the overcoating layer 170 through a photolithography process using a photo resist and then performing an etching process on the overcoating layer 170 using the mask pattern. In some embodiments, the photo resist may be a positive photo resist for improvement in productivity.

An interval (or a pitch) P between the top portions 181*a* of the protruding portions 181 according to an embodiment may be equal to the diameter of the bottom portion 181*c* of each protruding portion 181 or may be greater than the diameter of the bottom portion 181*c* of each protruding portion 181. In this case, when the interval P between the top portions 181*a* of the protruding portions 181 is greater than the diameter of the bottom portion 181*c* of each protruding portion 181, the density of the protruding portions 181 which are provided in the opening area OA of the pixel area PA decreases and thus external extraction efficiency of light emitted from the light emitting element ED can decrease.

The light emitting element ED emits light to the substrate 100 in accordance with a bottom emission system. The light emitting element ED according to an embodiment includes a first electrode E1, a light emitting layer EL, and a second electrode E2.

The first electrode E1 is formed on the overcoating layer 170 in the pixel area PA and is electrically connected to the source electrode 119*s* of the driving thin-film transistor DT. In some embodiments, one end of the first electrode E1 adjacent to the circuit area CA extends over the source electrode 119*s* of the driving thin-film transistor DT and is electrically connected to the source electrode 119*s* of the driving thin-film transistor DT via a contact hole CH provided in the overcoating layer 170 and the protective layer 130. The first electrode E1 comes into direct contact with the uneven portion 180 and thus has a shape (or a surface shape) which conforms to the shape of the uneven portion 180. For example, since the first electrode E1 is formed (or deposited) in a relatively small thickness on the overcoating layer 170, the first electrode E1 has a contour (or a second contour) which conforms to the contour (morphology) (or a first contour) of the uneven portion 180. Accordingly, since the first electrode E1 is formed in a conformal shape which conforms to the contour (or morphology) of the uneven portion 180 through a process of depositing a transparent conductive material, the first electrode E1 has the same sectional structure as the uneven portion 180.

The first electrode E1 serves as an anode electrode of the light emitting element ED. For example, the first electrode E1 is formed of a transparent conductive material such as transparent conductive oxide (TCO) such that light emitted from the light emitting layer EL is transmitted to the substrate 100. For example, the first electrode E1 may be formed of indium tin oxide (ITO) or indium zinc oxide (IZO).

The light emitting layer EL is formed on the first electrode E1 and comes into direct contact with the first electrode E1. In some embodiments, the light emitting layer EL is formed (or deposited) in a larger thickness than the first electrode E1 and thus has a contour (a third contour) which does not conform to the contours of the plurality of protruding portions 181 or the contour of the first electrode E1. For example, the light emitting layer EL has a shape which conforms to the contours of the first curved portions 181*b* of the plurality of protruding portions 181 or the first electrode E1, and the top portion of the light emitting layer EL overlapping the top portion 181*a* of each protruding portion 181 has an unsharp curved or rounded shape unlike the top portion 181*a* of the protruding portion 181. Accordingly, the light emitting layer EL is formed in a non-conformal shape which does not conform to the contour (or morphology) of the first electrode E1 through a deposition process and thus has a sectional structure which is different from that of the first electrode E1 (or the plurality of protruding portions).

The light emitting layer EL according to an embodiment is formed to have a thickness which increases toward the bottom portion 181*c* of the protruding portion 181 or the concave portion 183 of the uneven portion 180. For example, the light emitting layer EL has a first thickness T1 in an upper area including the top portion 181*a* of the protruding portion 181 and has a second thickness T2 which is larger than the first thickness T1 in the bottom portion 181*c* of the protruding portion 181. Accordingly, the light emitting layer EL includes an effective emission area EA and a non-effective emission area NEA depending on the thickness thereof. The effective emission area EA of the light emitting layer EL is set to an upper area of the protruding portions 181 and the non-effective emission area NEA of the light emitting layer EL is set to a lower area of the protruding portions 181. For example, the thickness of the light emitting layer EL may gradually decrease from a maximum thickness at or near the center of the concave portion 183 to a minimum thickness at or near the top portion 181*a* of the protruding portion 181. The effective emission area EA may correspond to a region near the upper area (e.g., surrounding the top portions 181*a*) of the protruding portions where the thickness of the light emitting layer EL is suitable for effective emission of light. The non-effective emission area NEA may correspond to a region near the lower area (e.g., near the centers of the concave portions 183) where the thickness of the light emitting layer EL is not suitable (e.g., too thick) for effective emission of light. It should be appreciated that the particular position of the boundary between the effective emission area EA and the non-effective emission area NEA may be varied in various embodiments.

The light emitting layer EL according to another embodiment may include two or more light emitting portions for emitting white light. For example, the light emitting layer EL includes a first light emitting portion and a second light emitting portion for emitting white light by mixing first light and second light. In some embodiments, the first light emitting portion emits first light and includes one of a blue light emitting portion, a green light emitting portion, a red light emitting portion, a yellow light emitting portion, and a yellowish green light emitting portion. The second light emitting portion includes a light emitting portion that emits light having a complementary color relationship with the first light out of the blue light emitting portion, the green light emitting portion, the red light emitting portion, the yellow light emitting portion, and the yellowish green light emitting portion.

The light emitting layer EL according to another embodiment may include one of a blue light emitting portion, a green light emitting portion, and a red light emitting portion. For example, when a pixel is a red pixel, a light emitting layer of the red pixel includes a red light emitting portion. When a pixel is a green pixel, a light emitting layer of the green pixel includes a green light emitting portion. When a pixel is a blue pixel, a light emitting layer of the blue pixel includes a blue light emitting portion.

The second electrode E2 is formed on the light emitting layer EL and comes into direct contact with the light emitting layer EL. In some embodiments, the second electrode E2 is formed (or deposited) on the light emitting layer EL to have a smaller thickness than the light emitting layer EL. In some embodiments, the second electrode E2 is formed (or deposited) in a relatively small thickness on the light emitting layer EL and thus has a contour which conforms to the contour of the light emitting layer EL. Accordingly, the second electrode E2 may have the same general sectional structure of the light emitting layer EL. For example, the cross-sectional profile or shape of the second electrode E2 may be substantially similar as that of the light emitting layer EL (e.g., with a curved or rounded tip overlying the top portions 181a).

The second electrode E2 may serve as a cathode electrode of the light emitting element ED. The second electrode E2 according to an embodiment includes a metal material having high reflectance to reflect light, which is emitted from the light emitting layer EL and is incident thereon, to the substrate 100. For example, the second electrode E2 may be formed in a multi-layer structure such as a stacked structure (Ti/Al/Ti) of aluminum Al and titanium Ti, a stacked structure (ITO/Al/ITO) of aluminum Al and ITO, an APC (Ag/Pd/Cu) alloy, and a stacked structure (ITO/APC/TIO) of an APC (Ag/Pd/Cu) alloy and ITO, or may have a single-layer structure including one material or two or more alloy materials selected from silver Ag, aluminum Al, molybdenum Mo, gold Au, magnesium Mg, calcium Ca, and barium Ba.

The opening area OA according to the present disclosure may further include a wavelength conversion layer 150.

The wavelength conversion layer 150 is provided between the substrate 100 and the overcoating layer 170 to overlap the opening area OA.

The wavelength conversion layer 150 according to an embodiment is provided on the protective layer 130 to overlap the opening area OA. That is, the wavelength conversion layer 150 is supported by the protective layer 130 and is covered with the overcoating layer 170, whereby the wavelength conversion layer 150 is provided between the protective layer 130 and the uneven portion 180 to overlap the opening area OA.

The wavelength conversion layer 150 according to another embodiment may be provided between the interlayer insulating film 117 and the protective layer 130 or provided between the substrate 100 and the interlayer insulating film 117 to overlap the opening area OA.

In a first example, the wavelength conversion layer 150 includes a color filter that transmits only wavelengths of a color which is set for the pixel out of light emitted from the light emitting element ED to the substrate 100. The wavelength conversion layer 150 according to an embodiment may transmit only light with wavelengths of red, green, or blue. In the light emitting display device according to an embodiment of the present disclosure, when one unit pixel includes first to third pixels adjacent to each other, the wavelength conversion layer provided in the first pixel may include a red color filter, the wavelength conversion layer provided in the second pixel may include a green color filter, and the wavelength conversion layer provided in the third pixel may include a blue color filter. In addition, in the light emitting display device according to an embodiment of the present disclosure, one unit pixel may further include a white pixel in which a wavelength conversion layer is not formed.

In a second example, the wavelength conversion layer 150 may include quantum dots having a size capable of re-emitting light according to light emitted from the light emitting element ED to the substrate 100 and discharging light of a color which is set for the pixel. In this case, the quantum dots can be selected from CdS, CdSe, CdTe, CdZnSeS, ZnS, ZnSe, GaAs, GaP, GaAs—P, Ga—Sb, InAs, InP, InSb, AlAs, AlP, and AlSb. For example, the wavelength conversion layer of the first pixel may include quantum dots of CdSe or InP, the wavelength conversion layer of the second pixel may include quantum dots of CdZnSeS, and the wavelength conversion layer of the third pixel may include quantum dots of ZnSe. In this way, the light emitting display device in which the wavelength conversion layer 150 includes quantum dots can realize high color reproducibility.

In a third example, the wavelength conversion layer 150 may include a color filter including quantum dots.

The light emitting display device according to embodiments of the present disclosure may further include a bank layer 190 and an encapsulation layer 200.

The bank layer 190 serves to define the opening area OA in the pixel area PA and is provided on an edge of the first electrode E1 and the overcoating layer 170. The bank layer 190 can be formed of an organic material such as a benzocyclobutene (BCB)-based resin, an acryl-based resin, or a polyimide resin. Alternatively, the bank layer 190 may be formed of a photosensitive material including a black pigment. In this case, the bank layer 190 also serves as a light blocking member between adjacent pixels.

The bank layer 190 according to an embodiment is formed on a flat surface 170a of the overcoating layer 170 to cover the edge of the first electrode E1 extending over the circuit area CA of the pixel area PA.

The bank layer 190 according to another embodiment may be provided to cover the edge of the uneven portion 180. That is, the light emitting layer EL may be formed on the first electrode E1, the bank layer 190, and a stepped portion between the first electrode E1 and the bank layer 190. In this case, when the light emitting layer EL is formed in a small thickness on the stepped portion between the first electrode E1 and the bank layer 190, electrical contact (short-circuit) between the second electrode E2 and the first electrode E1 may occur. In order to prevent this problem, the opening area OA which is defined by the bank layer 190 is formed to have a two-dimensional size (e.g., a two-dimensional area in the X-Z plane) which is smaller than that of the uneven portion 180 of the overcoating layer 170. An end 190a of the bank layer 190 according to an embodiment is disposed at or near an edge of the uneven portion 180 to decrease a height difference between the first electrode E1 and the bank layer 190. That is, the end 190a of the bank layer 190 defines a boundary between the circuit area CA and the opening area OA of the pixel area PA and can be disposed on the first electrode E1 overlapping the first curved portion 181b of the outermost protruding portion 181 out of the plurality of protruding portions 181. For example, the end 190a of the bank layer 190 is located between a flat surface 170a of the overcoating layer 170 and the bottom portion of the first curved portion 181b of the outermost protruding portion 181.

In some embodiments, the bank layer 190 may at least partially cover one or more of the concave portions 183 disposed at the edge of the uneven portion 180. For example, the bank layer 190 may cover about one and half the concave portion 183. In some embodiments, the end 190a of the bank layer 190 is located between a flat surface 170a of the overcoating layer 170 and the bottom portion of the first curved portion 181b.

Additionally, the wavelength conversion layer 150 according to one embodiment may extend to overlap the bank 190. For example, the ends of the wavelength conversion layer 150 may be located in the circuit area CA and may underlie portions of the bank 190.

The light emitting layer EL and the second electrode E2 of the light emitting element ED are also formed on the bank layer 190. That is, the light emitting layer EL is formed on the substrate 100 in which the first electrode E1 and the bank layer 190 are provided, and the second electrode E2 is formed to cover the light emitting layer EL.

The encapsulation layer 200 is formed on the substrate 100 to cover the second electrode E2, that is, the entire pixel. The encapsulation layer 200 serves to protect the thin-film transistors, the light emitting element ED, and the like from an external impact and to prevent oxygen and/or moisture and particles from invading into the light emitting element ED.

For example, the encapsulation layer 200 may include at least one inorganic film. The encapsulation layer 200 may further include at least one organic film. For example, the encapsulation layer 200 may include a first inorganic encapsulation layer, an organic encapsulation layer, and a second inorganic encapsulation layer. The first and second inorganic encapsulation layers may include one inorganic material out of a silicon oxide film SiOx, a silicon nitride film SiNx, a silicon oxynitride film SiON, a titanium oxide film TiOx, and an aluminum oxide film AlOx. The organic encapsulation layer may be formed of one organic material from an acryl resin, an epoxy resin, a phenolic resin, a polyamide resin, a polyimide resin, and a benzocyclobutene resin. The organic encapsulation layer may be referred to as a particle cover layer.

In some embodiments, the encapsulation layer 200 may be replaced with a filler surrounding the overall pixel. In some embodiments, the light emitting display device according to the present disclosure further includes an encapsulation substrate 300 that is attached to the substrate 100 with the filler interposed therebetween. The encapsulation substrate 300 may be formed of a glass material, a plastic material, or a metal material.

Additionally, the light emitting display device according to the present disclosure may further include a polarization film that is attached to a rear surface (or a light extraction surface) 100a of the substrate 100. The polarization film changes external light which is reflected by the thin-film transistors and/or the lines which are provided in the pixel into a circularly polarized state to improve visibility and a contrast range of the light emitting display device.

In the light emitting display device according to one or more embodiments of the present disclosure, a path or direction of light emitted from the light emitting element ED is changed by the uneven portion 180 provided in the effective emission area EA of the pixel to improve the light extraction efficiency, whereby it is possible to enhance luminance and to reduce power consumption. Since the light emitting display device according to one or more embodiments of the present disclosure includes the light emitting layer EL having a contour different from the contours of the plurality of protruding portions 181 provided in the opening area OA of the pixel, it is possible to further improve the external extraction efficiency of light. That is, since the light emitting display device according to embodiments of the present disclosure includes the protruding portions 181 having a sharp top portion 181a and the light emitting layer EL having a convex curved shape overlapping the top portions 181a of the protruding portions 181, light which is not extracted to the outside due to total reflection repeated in the light emitting layer EL is reflected by the convex curved shape of the light emitting element ED formed on the top portions 181a of the protruding portions 181 and is extracted to the outside, and thus it is possible to further improve external extraction efficiency of light.

Figure 6:
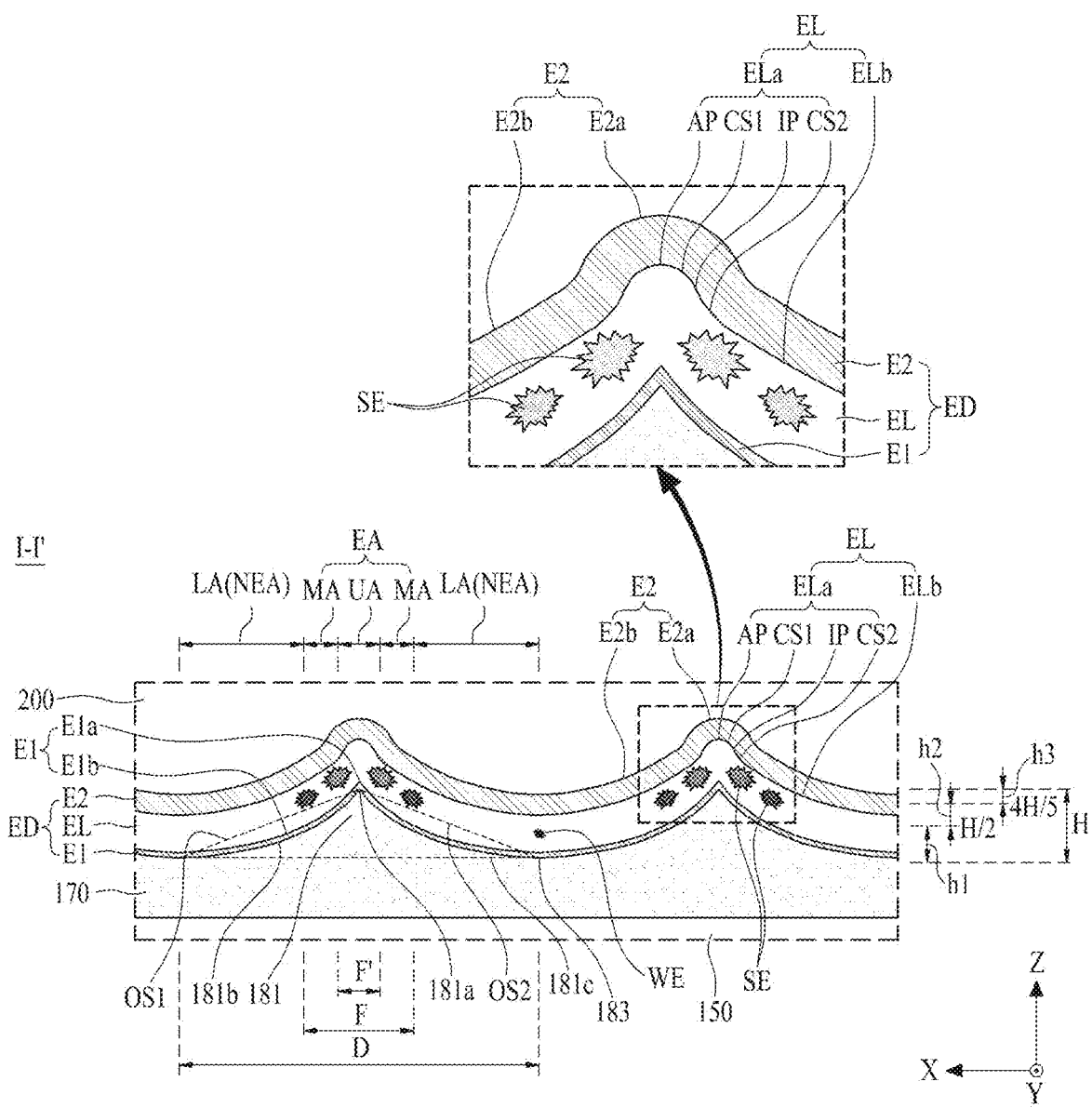
FIG. 6 is a sectional view taken along line I-I' in FIG. 5.
Figure 7:
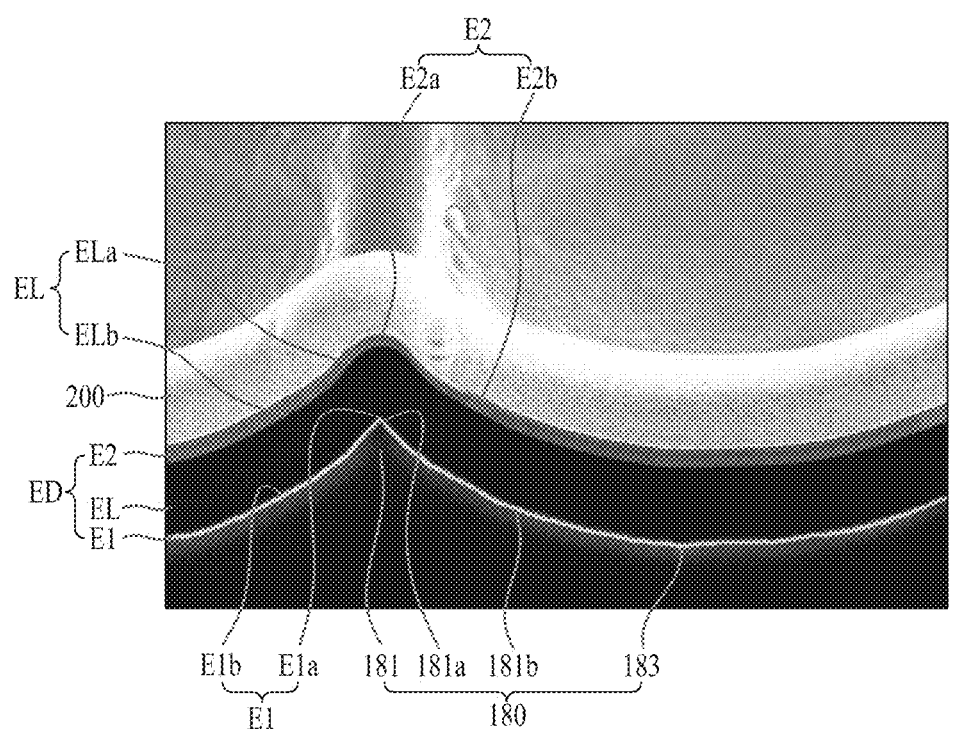
FIG. 7 is an enlarged diagram of a microscope image of a protruding portion illustrated in FIG. 6.
Figure 8:
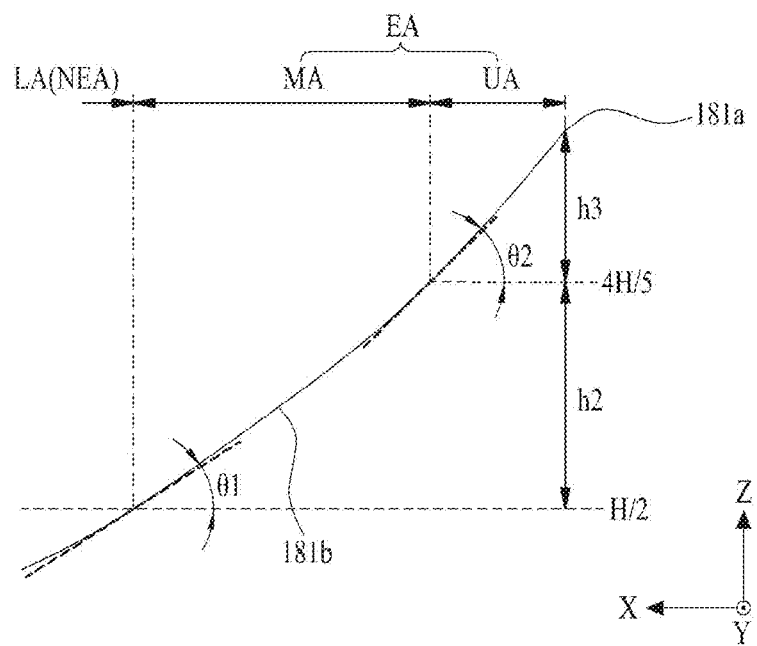
FIG. 8 is a diagram illustrating a tangent slope of the protruding portion illustrated in FIG. 6.

FIG. 6 is a sectional view taken along line I-I' in FIG. 5. FIG. 7 is an enlarged diagram of a microscope image of a protruding portion illustrated in FIG. 6. FIG. 8 is a diagram illustrating a slope of a first curved portion in the protruding portion illustrated in FIG. 6. These are diagrams illustrating sectional structures of the uneven portion and the light emitting element according to embodiments of the present disclosure.

Referring to FIGS. 6 to 8, the uneven portion 180 according to an embodiment of the present disclosure includes a plurality of protruding portions 181 having a top portion 181a (or a first apex portion) and thus extracts light, which is not extracted to the outside due to total reflection repeated in the light emitting layer EL, to the outside. Accordingly, external extraction efficiency of light is determined depending on the shapes of the plurality of protruding portions 181 and the light emitting element ED.

Each of the plurality of protruding portions 181 includes a lower area LA, a middle area MA, and an upper area UA with respect to a height H thereof.

The lower area LA is defined as an area in which a height of the protruding portion 181 corresponds to a first height h1 between the bottom portion 181c of the protruding portion 181 and a position of half height H/2 with respect to the total height H between the bottom portion 181c and the top portion 181a of the protruding portion 181. The first height h1 is not a particular height, but instead represents a range of heights between a height at the bottom portion 181c and a height that is half of the total height H. Thus, the lower area LA may be an area in which the height of the protruding portion 181 is between the height of the bottom portion 181c and the half height H/2.

The middle area MA is provided between the lower area LA and the upper area UA and is defined as an area in which the height of the protruding portion 181 corresponds to a second height h2 between the position of half height H/2 and a position of 4/5 height 4H/5 with respect to the total height H between the bottom portion 181c and the top portion 181a of the protruding portion 181. The middle area MA may thus be an area in which the height of the protruding portion 181 is between the half height H/2 and the 4/5 height 4H/5.

The upper area UA is provided on the middle area MA and is defined as an area in which the height of the protruding portion 181 corresponds to a third height h3 between the position of 4/5 height 4H/5 and the top portion 181a with respect to the total height H between the bottom portion 181c and the top portion 181a of the protruding portion 181. The upper area UA may thus be an area in which the height of the protruding portion 181 is between the 4/5 height 4H/5 and the apex of the top portion 181a.

Each of the plurality of protruding portions 181 includes a lower region (or a lower convex portion) and an upper region (or an upper convex portion) with respect to the position of half height H/2. For example, the lower region of each of the plurality of protruding portions 181 may include the lower area LA and the upper region of each of the plurality of protruding portions 181 may include the middle area MA and the upper area UA.

Each of the plurality of protruding portions 181 includes a first curved portion 181b which is provided to be concave between the top portion 181a and the bottom portion 181c, and the protruding portion has a triangular sectional structure including a vertex corresponding to the top portion 181a, a bottom side corresponding to the bottom portion 181c, and hypotenuses OS1 and OS2 corresponding to the first curved portions 181b. The hypotenuses OS1 and OS2 are not necessarily aligned with the boundaries of the curved portions 181b, since the curved portions 181b are curved and the hypotenuses may be defined as straight lines which extend directly between the vertex (e.g., the apex of the top portion 181a) and the bottom portions 181c (e.g., the center point of the concave portions 183).

The top portion 181a of each of the plurality of protruding portions 181 is formed in a sharp apex structure to enhance light extraction efficiency of the pixel, and the first curved portion 181b of each of the plurality of protruding portions 181 is formed in a concave curved shape between the top portion 181a and the bottom portion 181c.

The first curved portion 181b of each of the plurality of protruding portions 181 has a tangent slope which decreases gradually from the top portion 181a to the bottom portion 181c. In this case, the tangent slope is defined as an angle between a horizontal line parallel to the bottom portion 181c of the protruding portion 181 and the tangent of the first curved portion 181b, for example, which may be measured at any point along the first curved portion 181b.

The first curved portion 181b according to an embodiment has a largest tangent slope, that is, a maximum tangent slope, in an effective emission area EA, and the effective emission area EA may include the position of 4/5 height 4H/5 of the protruding portions 181. In some embodiments, the first curved portion 181b has a maximum tangent slope at or above the position of 4/5 height 4H/5 which is a boundary between the middle area MA and the upper area UA of the protruding portion 181. For example, the first curved portion 181b may have a first tangent slope θ1 at the position of half height H/2 of the protruding portion 181 and a second tangent slope θ2 at the position of 4/5 height 4H/5 of the protruding portion 181. As shown in FIG. 8, the second tangent slope θ2 has an angle larger than the first tangent slope θ1 such that light emitted from the effective emission area EA of the protruding portions 181 is not trapped in the light emitting element ED but is extracted to the outside as much as possible. When the second tangent slope θ2 has an angle smaller than the first tangent slope θ1, the upper area UA of the protruding portion 181 has a slow slope and thus light emitted from the effective emission area EA is not extracted to the outside due to total reflection but is trapped in the light emitting element ED, whereby the light extraction efficiency decreases.

The light emitting element ED according to some embodiments of the present disclosure has a maximum amount of light emitted at the maximum tangent slope of the protruding portions 181. When the maximum tangent slope of the protruding portions 181 is located in the effective emission area EA, light emitted from the light emitting element ED propagates at an angle less than a total reflection threshold value, and the maximum light extraction efficiency can be achieved as the external emission efficiency increases due to multiple reflection. For this purpose, in some embodiments of the present disclosure, by locating the maximum tangent slope of the protruding portions 181 in the effective emission area EA of the protruding portions 181, for example, at or above the position of 4/5 height 4H/5 which is a boundary between the middle area MA and the upper area UA, it is possible to enhance the external extraction efficiency of light emitted from the effective emission area EA of the protruding portions 181. Moreover, by gradually increasing the maximum tangent slope of the protruding portions 181 from the position of 4/5 height 4H/5 to the top portion 181a, it is possible to maximize the external extraction efficiency of light emitted from the effective emission area EA of the protruding portions 181.

The first electrode E1 of the light emitting element ED according to the present disclosure is formed to be in contact with the surfaces of the plurality of protruding portions 181 and has a relative small thickness, and thus has a contour which conforms to the contours of the plurality of protruding portions 181. For example, the first electrode E1 is formed to cover the plurality of protruding portions 181 in a conformal manner through a process of depositing a transparent conductive material. For example, the first electrode E1 may include a second apex portion E1a having a sharp shape which is formed on the top portion 181a of each of the plurality of protruding portions 181 and a second curved portion E1b having a concave curved shape which is formed on the first curved portion 181b of each of the plurality of protruding portions 181. In some embodiments, the second curved portion E1b has a symmetric structure with respect to the second apex portion E1a, for example, in a cross-sectional view second curved portions E1b may extend from opposite sides of the second apex portion E1a and may be symmetrical with respect to one another.

The light emitting layer EL of the light emitting element ED according to the present disclosure is formed to have a thickness increasing from the upper area UA to the lower area LA depending on the shapes of the protruding portions 181. For example, when the light emitting layer EL is deposited using a deposition method, a deposition material for the light emitting layer EL has straightness in a vertical direction Z and thus the light emitting layer EL has different thicknesses in the upper area UA, the middle area MA, and the lower area LA of the protruding portions 181 depending on the tangent slope of the protruding portions 181. That is, the light emitting layer EL has a smallest thickness in the upper area UA of the protruding portions 181 in which the tangent slope is relatively large and has a largest thickness in the lower area LA of the protruding portions 181 in which the tangent slope is relatively low (or relatively slow).

When the light emitting layer EL includes an organic light emitting layer, emission of light from the light emitting element ED occurs mainly in an area having a high current density. In the light emitting element ED according to embodiments of the present disclosure, relatively strong emission of light SE occurs due to a relatively high current density in the upper area UA and the middle area MA of the protruding portions 181 having a relatively small thickness, and relatively weak (or slight) emission of light WE occurs due to a relatively low current density in the lower area LA of the protruding portions 181 having a relatively large thickness. Accordingly, the upper area UA and the middle area MA of each of the plurality of protruding portions 181 are defined as an effective emission area EA (or a partial emission area) in the opening area OA, and the lower area LA of each of the plurality of protruding portions 181 is defined as a non-effective emission area NEA (or a non-emission area) in the opening area OA.

The light emitting layer EL is formed to cover the first electrode E1 or the plurality of protruding portions 181 in a non-conformal manner. For example, the light emitting layer EL includes a curved or rounded upper portion ELa (which may be referred to herein as an uplifted portion ELa, or a convex protruding portion) which overlaps the top portion 181a of each of the plurality of protruding portions 181 and a third curved portion ELb which overlaps the first curved portion 181b of each of the plurality of protruding portions 181.

The third curved portion ELb is formed on the second curved portion E1b of the first electrode E1 and has a symmetric structure with respect to the uplifted portion ELa (e.g., in the cross-sectional view, the third curved portions ELb may extend from opposite sides of the uplifted portion ELa and may be symmetrical with respect to one another. The light emitting layer EL including the third curved portion ELb is formed to have a thickness which increases gradually toward the bottom portion 181c of the protruding portions 181 or the concave portion 183 of the uneven portion 180. That is, the third curved portion ELb of the light emitting layer EL has a first thickness in the upper region MA and UA including the top portions 181a of the convex portion 181 and has a second thickness larger than the first thickness in the bottom portion 181c of the protruding portion 181. Accordingly, the light emitting layer EL strongly emits light in the upper region MA and UA of each of the plurality of protruding portions 181 having a high current density due to the relatively small first thickness and thus it is possible to enhance light extraction efficiency. On the other hand, the light emitting layer EL weakly emits light in the lower region LA of each of the plurality of protruding portions 181 having a low current density due to the relatively large second thickness and thus it is possible to reduce power consumption.

The uplifted portion ELa is formed convex to have a non-conformal shape with respect to the sharp top portion 181a of each of the plurality of protruding portions 181. That is, the uplifted portion ELa protrudes from the third curved portion ELb overlapping the top portion 181a of the each of the plurality of protruding portions 181 to cover the top portion 181a of each of the plurality of protruding portions 181. The uplifted portion ELa may be referred to as a convex protruding portion.

The uplifted portion ELa is formed to have a curvature for preventing light, which is totally reflected and incident in the light emitting layer EL due to emission of light from the light emitting layer EL, from being totally reflected in the light emitting layer EL again. For example, the uplifted portion ELa may have a dome or bell structure having a convex sectional shape. The uplifted portion ELa reflects light which is totally reflected in the light emitting layer EL and incident due to emission of light from the light emitting layer EL toward the substrate 100 to increase the external extraction efficiency of light which is emitted from the light emitting layer EL. For example, the uplifted portion ELa serves as a lens that reflects light which is emitted from the effective emission area EA of the light emitting element ED and is incident toward the substrate 100.

The uplifted portion ELa according to an embodiment may have a dome structure having an inflection portion IP. That is, the uplifted portion ELa according to an embodiment may include an apex portion AP, an inflection portion IP, a convex surface CS1, and a concave surface CS2. The inflection portion IP may be located at an inflection point between the convex surface CS1 and the concave surface CS1. The uplifted portion ELa has a symmetric structure with respect to the apex portion AP.

The apex portion AP overlaps the top portion 181a of each of the plurality of protruding portions 181. That is, the apex portion AP overlaps the second apex portion E1a of the first electrode E1 having a sharp shape.

The inflection portion IP is located between the apex portion AP and the third curved portion ELb. For example, the inflection portion IP may be located on the first curved portion 181b between the top portion 181a and the position of 4/5 height 4H/5 of the protruding portion 181 to reflect light which is totally reflected from the top portion 181a of the protruding portion 181 toward the substrate, whereby it is possible to enhance external extraction efficiency of light. The inflection portion IP is also referred to as an inflection point.

The convex surface CS1 is formed to be convex from the apex portion AP. That is, the convex surface CS1 is formed to be convex between the apex portion AP and the inflection portion IP. The concave surface CS2 is formed to be concave from the convex surface CS1. That is, the concave surface CS2 is formed to be concave between the inflection portion IP and the third curved portion ELb. The convex surface CS1 and the concave surface CS2 change a path or direction of light which is incident on the uplifted portion ELa from the light emitting element ED toward the substrate to prevent total reflection of incident light, whereby it is possible to enhance light extraction efficiency of a pixel.

Since the second electrode E2 of the light emitting element ED according to the present disclosure is formed to be in contact with the surface of the light emitting layer EL and has a thickness smaller than that of the light emitting layer EL, the second electrode E2 has a contour which conforms to the contour of the light emitting layer EL. For example, the second electrode E2 may include a convex dome portion E2a that overlaps the uplifted portion ELa of the light emitting layer EL and a fourth curved portion E2b that is formed on the third curved portion ELb of the light emitting layer EL.

Figure 9:
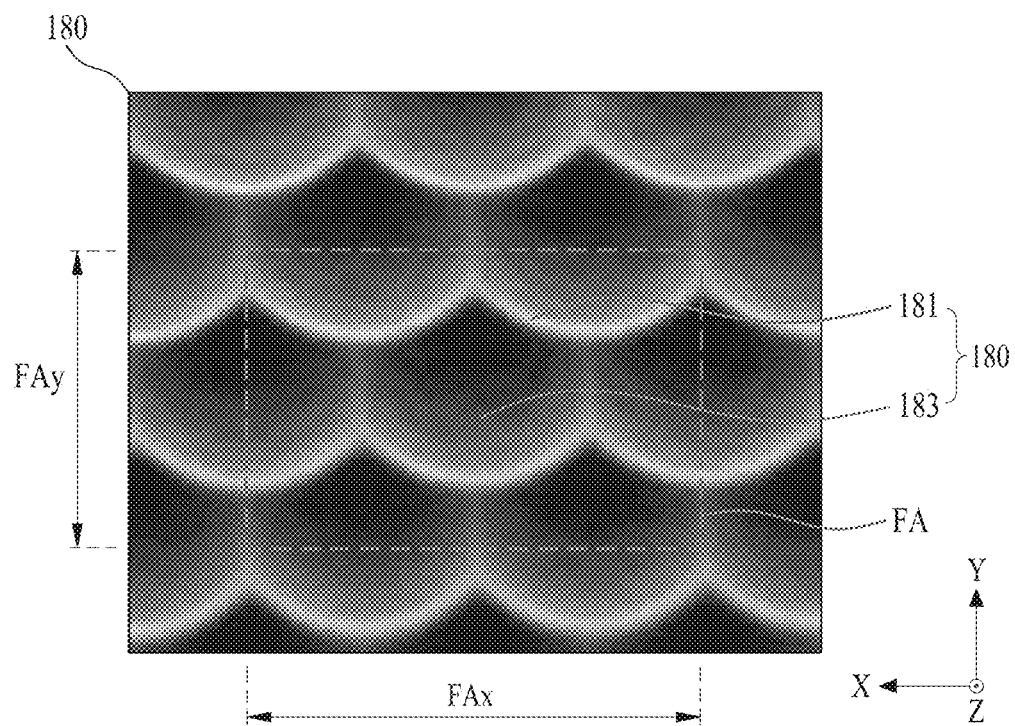
FIG. 9 is a microscope image illustrating an uneven portion which is provided in a pixel in a light emitting display device according to an example of the present disclosure.
Figure 10:
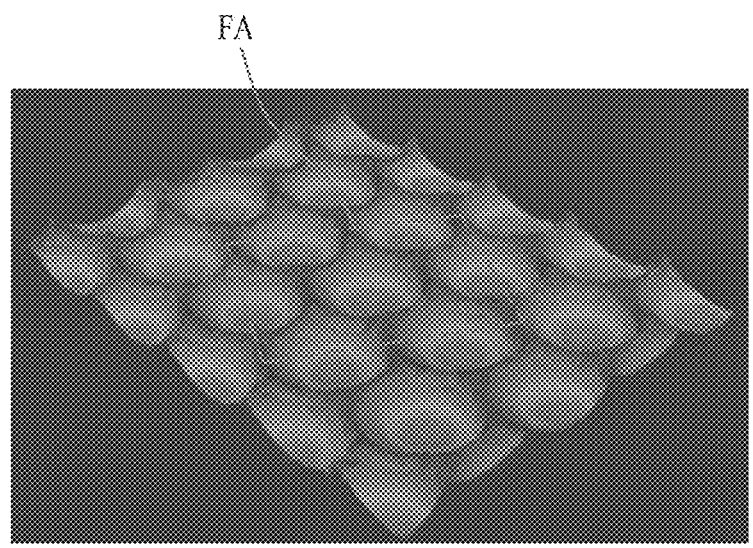
FIG. 10 is a diagram illustrating a result of roughness measurement of the uneven portion illustrated in FIG. 9.

FIG. 9 is a microscope image illustrating an uneven portion which is provided in a pixel in the light emitting display device according to an example of the present disclosure. FIG. 10 is a diagram illustrating a result of roughness measurement of the uneven portion illustrated in FIG. 9.

Referring to FIGS. 9 and 10, as well as FIG. 5, a unit area FA (or a unit measurement area) of an uneven portion 180 according to some embodiments may be defined as a size corresponding to a size of four complete concave portions 183 adjacent to each other in the first direction X and the second direction Y with respect to the bottom surfaces of the protruding portions 181. For example, the unit area FA may have a size including one full concave portion 183 (e.g., in a central region of the unit area FA) and halves of six concave portions 183 surrounding the one concave portion 183. In some embodiments, the unit area FA has a first length (or a horizontal width) FAx connecting the top portions 181a of three protruding portions 181 adjacent to each other in the first direction X and a second length (or a vertical width) FAy connecting the middles of two protruding portions 181 adjacent to each other in the second direction Y with one concave portion 183 interposed therebetween.

In the light emitting display device according to some embodiments of the present disclosure, the surface area of the uneven portion 180 and the surface area of the light emitting element ED may be different from each other depending on the shape and the height of the protruding portions 181 which are disposed in the uneven portion 180 of each pixel. That is, in the light emitting element ED, the first electrode E1 is formed to be conformal to the protruding portions 181, the light emitting layer EL is formed to be non-conformal to the first electrode E1, and the second electrode E2 is formed to be conformal to the light emitting layer EL, whereby the surface area of the second electrode E2 which is disposed as an uppermost layer of the light emitting element ED may be different from the surface area of the uneven portion 180 due to the light emitting layer EL which is formed to be non-conformal to the protruding portions 181.

Measurement results of the surface area and the surface area increase rate SIR of the second electrode E2 and the surface area and the surface area increase rate SIR of the uneven portion 180 with respect to the unit areas at first to fifth points (e.g., first to fifth regions) which are different from each other and which are set on the pixel array unit of the light emitting display device according to an example of the present disclosure are described in Table 1.

TABLE 1

|  | Unit area ($\mu m^2$) | Surface area ($\mu m^2$) | SIR |
| --- | --- | --- | --- |
| 1-1st experimental example | 107.59 | 143.25 | 1.3315 |
| 1-2nd experimental example | 108.44 | 137.11 | 1.2643 |
| 2-1st experimental example | 108.28 | 137.73 | 1.2743 |
| 2-2nd experimental example | 107.79 | 127.72 | 1.1848 |
| 3-1st experimental example | 108.28 | 135.78 | 1.2539 |
| 3-2nd experimental example | 107.66 | 128.21 | 1.1909 |
| 4-1st experimental example | 108.26 | 139.43 | 1.2879 |
| 4-2nd experimental example | 107.59 | 134.34 | 1.2486 |
| 5-1st experimental example | 107.59 | 139.28 | 1.2946 |
| 5-2nd experimental example | 108.10 | 133.53 | 1.2352 |

In Table 1, 1-1st to 5-1st experimental examples represent measurements results of the unit areas at the first to fifth points and the surface areas and the surface area increase rates SIR of the uneven portions 180 disposed in the unit areas, and the 1-2nd to 5-2nd experimental examples represent measurements results of the unit areas at the first to fifth points and the surface areas and the surface area increase rates SIR of the second electrodes disposed in the unit areas. In Table 1, the unit area is set with respect to the bottom portion of the protruding portions 181 and has a different value for each experimental example due to measurement errors of a measuring device, but has substantially the same value within a measurement error range. The surface areas in the 1-1st to 5-1st experimental examples are the measurement results of the surface area per unit area of the uneven portion 180 in a state in which the light emitting element including the first electrode, the light emitting layer, and the second electrode has been removed in the light emitting display device, and the surface areas in the 1-2nd to 5-2nd experimental examples are the measurement results of the surface area per unit area of the second electrode in a state in which the light emitting element including the first electrode, the light emitting layer, and the second electrode has not been removed in the light emitting display device.

As can be seen from Table 1, the uneven portion 180 has a surface area larger than the unit area. In this case, it can be seen that the uneven portion 180 including the protruding portions 181 has a surface area increase rate SIR in a range of 1.25 to 1.34. On the other hand, it can be seen that the second electrode has a surface area larger than the unit area and smaller than the surface area of the uneven portion 180. In this case, it can be seen that the second electrode provided on the uneven portion 180 has a surface area increase rate SIR in a range of 1.18 to 1.27 with respect to the unit area of the second electrode provided on the uneven portion 180. As a result, it can be construed that the uneven portion 180 has a surface area increase rate SIR that increases with respect to the unit area depending on the total heights and the shapes of the protruding portions 181 and it can be seen that the second electrode has a surface area increase rate SIR less than the surface area increase rate SIR of the uneven portion 180 because the light emitting layer is formed to be non-conformal to the uneven portion 180. For example, since the light emitting layer has a thickness which increases gradually toward the bottom portion 181c of the protruding portion 181 or the concave portion 183 of the uneven portion 180, the second electrode may have a surface area increase rate SIR less than the surface area increase rate SIR of the uneven portion 180 due to a decrease in the surface area of the light emitting layer formed on the concave portion 183.

In the light emitting display device according to one or more embodiments of the present disclosure, the emission efficiency of the light emitting element ED is determined depending on the shapes of the protruding portions 181 and light extraction efficiency is determined depending on the shapes of the protruding portions 181 and the shape of the light emitting element ED. A current efficiency enhancement of the light emitting display device according to embodiments of the present disclosure increases as the emission efficiency of the light emitting element ED increases. Accordingly, the shape of the protruding portions 181 may serve as a factor for determining the emission efficiency, the light extraction efficiency, and the current efficiency enhancement of the light emitting display device. Examples of the factor for determining the shape of the protruding portion 181 include a diameter D, a height H, a half-height width F (Full Width Half Max), an aspect ratio AR, a half-height aspect ratio F_AR, a half-height sharpness Rm, a 4/5-height width F', a 4/5-height aspect ratio F'_AR, and a tangent slope of the protruding portion 181.

The aspect ratio AR of the protruding portion 181 refers to a ratio of the height H to a radius D/2 of the protruding portion 181 and is defined as a value H/(D/2) obtained by dividing the height H by the radius D/2 of the bottom side.

The half-height aspect ratio F_AR of the protruding portion 181 refers to a ratio of the height H to the half-height width F of the protruding portion 181 and may be defined as a value (H/2)(F/2) obtained by dividing the half height H/2 by the radius F/2 at the position of half height H/2 or may be defined as a value H/F obtained by dividing the height H by the half-height width F. In this case, the half-height width F may refer to a bottom side width at a position of half height (or 50% point) H/2 of the height H with respect to the bottom portion 181c (or the bottom side) of the protruding portion 181.

The half-height sharpness Rm of the protruding portion 181 refers to a ratio of the half-height aspect ratio F_AR to the aspect ratio AR and may be defined as a value (F_AR)/(AR) obtained by dividing the half-height aspect ratio F_AR by the aspect ratio AR.

The 4/5-height aspect ratio F'_AR is an aspect ratio for the width F' at the position of 4/5 height 4H/5, refers to a ratio of the 4/5 height 4H/5 to the half width F'/2 at the position of 4/5 height 4H/5, and may be defined as a value (4H/5)/(F'/2) obtained by dividing the 4/5 height 4H/5 by the half width F'/2 at the position of 4/5 height 4H/5. In this case, the 4/5-height width F' of the protruding portion 181 may refer to the bottom side width at the position of 4/5 height (or 80% point) 4H/5 of the total height H of the protruding portion 181 with respect to the bottom portion 181c (or the bottom side) of the protruding portion 181.

In the protruding portion 181 according to the present disclosure, the factor for determining the shape of the top portion 181a may be the 4/5-height aspect ratio F'_AR. Accordingly, the 4/5-height aspect ratio F'_AR of the protruding portions 181 range from 0.35 to 0.6. That is, the protruding portions 181 have a 4/5-height aspect ratio F'_AR in the range of 0.35 to 0.6 and thus include the top portion 181a having a sharp apex structure.

When the 4/5-height aspect ratio F'_AR of the protruding portions 181 ranges from 0.35 to 0.6, the light extraction efficiency is higher than when the 4/5-height aspect ratio F'_AR of the protruding portions 181 is less than 0.35 or greater than 0.6. For example, when the 4/5-height aspect ratio F'_AR of the protruding portions 181 is greater than 0.6, the tangent slope of the upper area UA of the protruding portions 181 increases as the height H of the protruding portions 181 increases, and the amount of light trapped in the light emitting element ED increases to decrease the light extraction efficiency. When the 4/5-height aspect ratio F'_AR of the protruding portions 181 is less than 0.35, the third height h3 of the upper area UA of the protruding portions 181 is excessively decreased or flattened to form waveguides and thus light emitted from the light emitting element ED does not propagate to the substrate, is repeatedly totally reflected, and is trapped in the light emitting element ED, whereby the light extraction efficiency can be decreased. Particularly, when the protrusions 181 have a 4/5-height aspect ratio F'_AR less than 0.35, the top portions 181a of the protruding portions 181 have a sectional structure of a bell shape or a Gaussian curve which is not sharp and thus the light emitting element ED has a shape which conforms to the contours of the protruding portions 181, whereby the uplifted portion ELa is not formed and an effect based on the uplifted portion ELa cannot be expected.

The shape of the protruding portions 181 may vary depending on the aspect ratio AR, the half-height aspect ratio F_AR, and the half-height sharpness Rm even when the 4/5-height aspect ratio F'_AR of the protruding portions 181 ranges from 0.35 to 0.6.

In the light emitting display device according to the present disclosure, since the uneven portion including a plurality of apex portions provided in the opening area of each pixel includes a plurality of protruding portions, the uneven portion has a surface area increase rate based on the shapes of the protruding portions and the intervals between the protruding portions. The surface area increase rate of the uneven portion is expressed by a ratio of the areas of the protruding portions to the unit area. For example, the surface area increase rate of the uneven portion is defined as a value obtained by dividing the area of the protruding portions disposed in the unit area by the unit area. The surface area increase rate of the uneven portion is a factor representing the shapes of the protruding portions disposed in the unit area and thus may serve as an additional factor for determining the emission efficiency, the light extraction efficiency, and the current efficiency enhancement of the light emitting display device.

The uneven portion 180 according to one or more embodiments of the present disclosure has a surface area increase rate of 1.05 to 2.0 with respect to the unit area.

The light extraction efficiency of each pixel according to one or more embodiments of the present disclosure may vary depending on the aspect ratio AR, the half-height sharpness Rm, the half-height aspect ratio F_AR, and the 4/5-height aspect ratio F'_AR even when the surface area increase rate of the uneven portion 180 ranges from 1.05 to 2.0. Accordingly, when the surface area increase rate of the uneven portion 180 ranges from 1.05 to 2.0, the protruding portions 181 have an aspect ratio AR in a range of 0.35 to 0.48, a half-height aspect ratio F_AR in a range of 0.45 to 0.60, a 4/5-height aspect ratio F'_AR in a range of 0.45 to 0.60, and a half-height sharpness Rm in a range of 1.1 to 2.0.

Figure 11A:
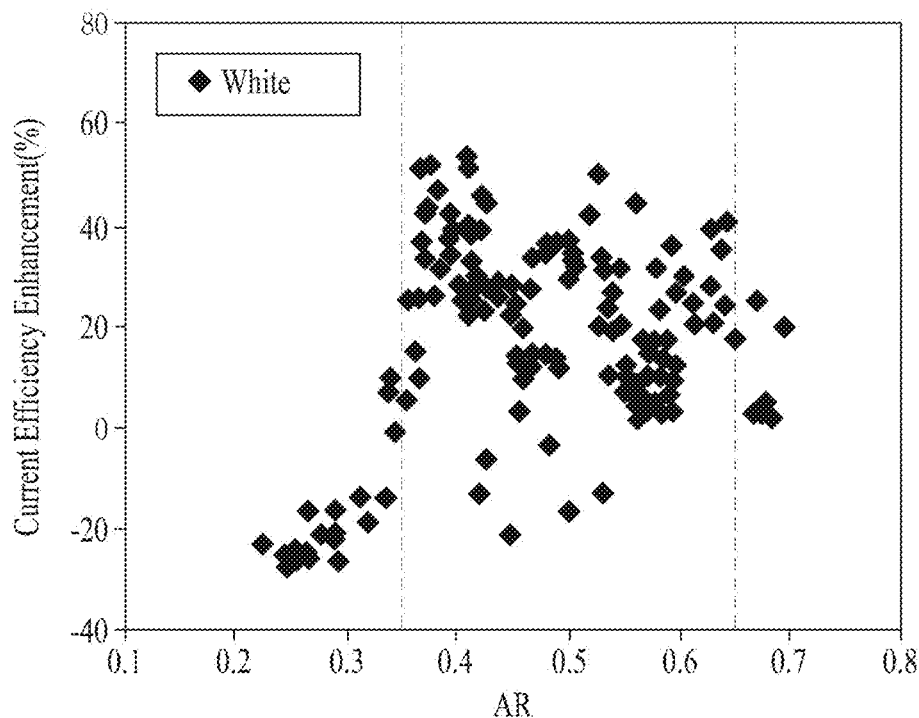
FIG. 11A is a graph illustrating a current efficiency enhancement of a white pixel corresponding to an aspect ratio of a protruding portion in the light emitting display device according to the present disclosure.
Figure 11B:
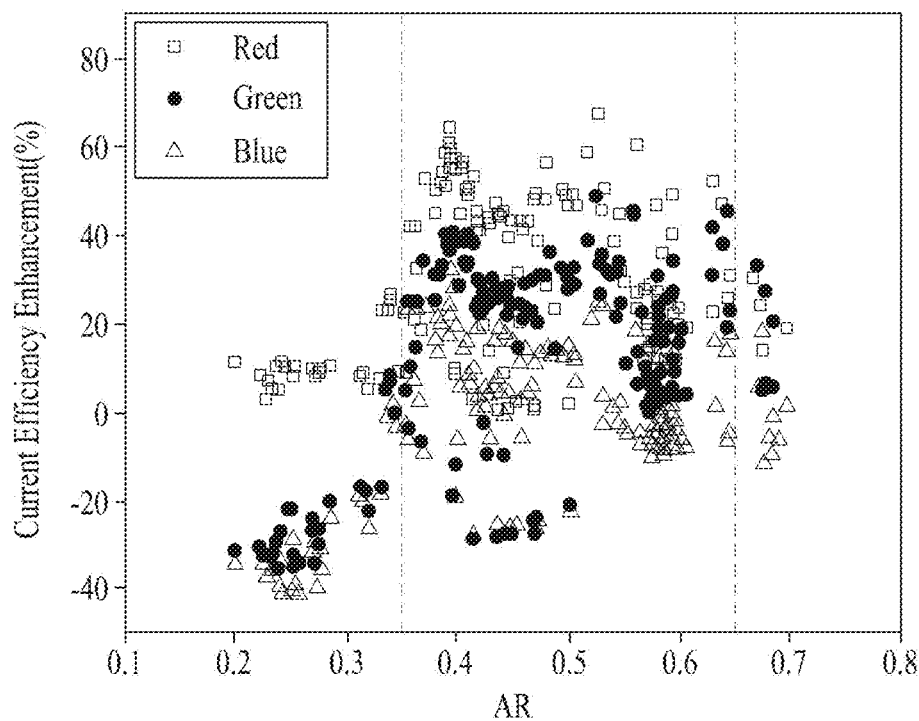
FIG. 11B is a graph illustrating current efficiency enhancements of a red pixel, a green pixel, and a blue pixel corresponding to an aspect ratio of a protruding portion in the light emitting display device according to the present disclosure.

FIG. 11A is a graph illustrating a current efficiency enhancement of a white pixel corresponding to an aspect ratio of a protruding portion in the light emitting display device according to the present disclosure. FIG. 11B is a graph illustrating current efficiency enhancements of a red pixel, a green pixel, and a blue pixel corresponding to an aspect ratio of a protruding portion in the light emitting display device according to the present disclosure.

Referring to FIGS. 11A and 11B along with FIG. 6, when the aspect ratio AR of the protruding portions 181 ranges from 0.35 to 0.65 in the light emitting display device according to one or more embodiments of the present disclosure, it can be seen that the current efficiency enhancement is more excellent (e.g., greater current efficiency enhancement) than cases in which the aspect ratio AR of the protruding portions 181 is less than 0.35 or greater than 0.65. That is, it can be seen that the current efficiency enhancement of the light emitting element ED has a tendency to decrease when the aspect ratio AR of the protruding portions 181 is greater than 0.65 and has a maximum value when the aspect ratio AR of the protruding portions 181 ranges from 0.35 to 0.65.

When the aspect ratio AR of the protruding portions 181 is less than 0.35, the height H of the protruding portions 181 is excessively decreased or flattened to form waveguides and thus light emitted from the light emitting element ED does not propagate to the substrate, is repeatedly totally reflected, and is trapped in the light emitting element ED, whereby the light extraction efficiency can be decreased. When the aspect ratio AR of the protruding portions 181 is greater than 0.65, the height H of the protruding portions 181 is excessively increased, and reflectance of external light is increased, whereby black luminance cannot be realized.

Accordingly, when the aspect ratio AR of the protruding portions 181 range from 0.35 to 0.65, a maximum current efficiency enhancement can be achieved and the light emitting element ED can have a maximum emission efficiency in this case.

Figure 12A:
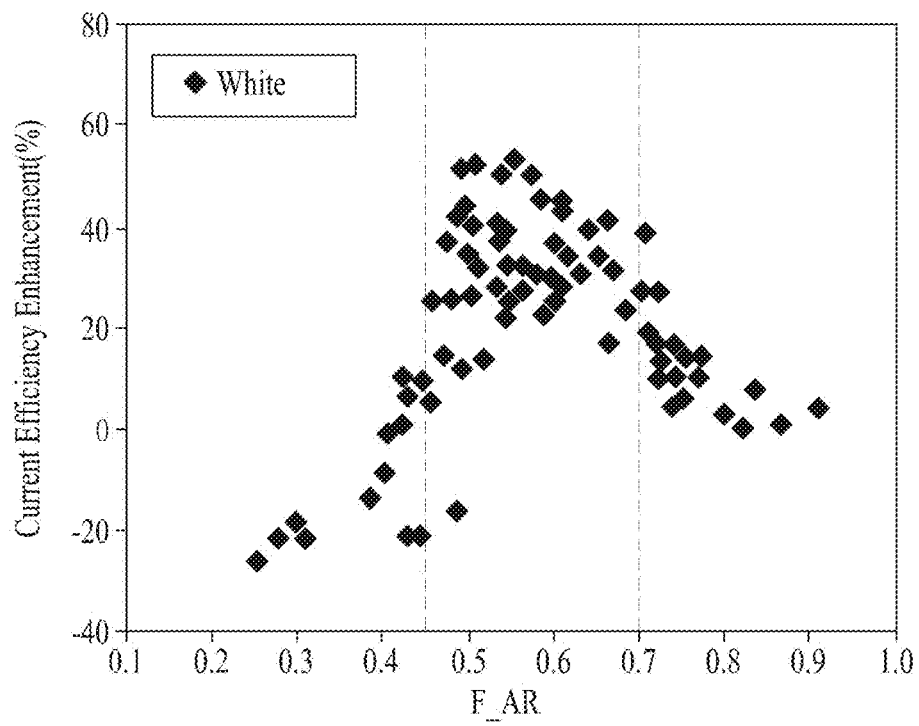
FIG. 12A is a graph illustrating a current efficiency enhancement of a white pixel corresponding to a half-height aspect ratio of a protruding portion in the light emitting display device according to the present disclosure.
Figure 12B:
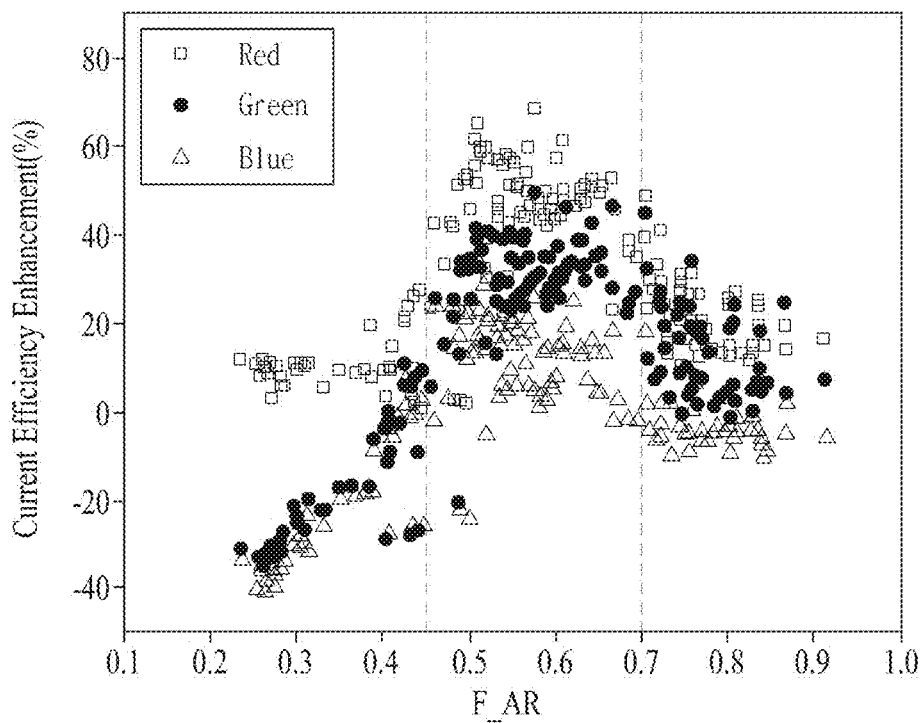
FIG. 12B is a graph illustrating current efficiency enhancements of a red pixel, a green pixel, and a blue pixel corresponding to a half-height aspect ratio of a protruding portion in the light emitting display device according to the present disclosure.

FIG. 12A is a graph illustrating a current efficiency enhancement of a white pixel corresponding to a half-height aspect ratio of a protruding portion in the light emitting display device according to the present disclosure. FIG. 12B is a graph illustrating current efficiency enhancements of a red pixel, a green pixel, and a blue pixel corresponding to a half-height aspect ratio of a protruding portion in the light emitting display device according to the present disclosure.

Referring to FIGS. 12A and 12B along with FIG. 6, when the half-height aspect ratio F_AR of the protruding portions 181 ranges from 0.45 to 0.7 in the light emitting display device according to the present disclosure, it can be seen that the current efficiency enhancement is more excellent (e.g., greater current efficiency enhancement) than cases in which the half-height aspect ratio F_AR of the protruding portions 181 is less than 0.45 or greater than 0.7. That is, it can be seen that the current efficiency enhancement of the light emitting element ED has a tendency to decrease when the half-height aspect ratio F_AR of the protruding portions 181 is greater than 0.7 and has a maximum value when the half-height aspect ratio F_AR of the protruding portions 181 ranges from 0.45 to 0.7.

When the half-height aspect ratio F_AR of the protruding portions 181 is less than 0.45, the height h2+h3 of the middle area MA and the upper area UA of the protruding portions 181 is excessively decreased or flattened to form waveguides and thus light emitted from the light emitting element ED does not propagate to the substrate, is repeatedly totally reflected, and is trapped in the light emitting element ED, whereby the light extraction efficiency can be decreased. When the half-height aspect ratio F_AR of the protruding portions 181 is greater than 0.7, the height H of the protruding portions 181 is excessively increased, and reflectance of external light is increased, whereby black luminance cannot be realized.

Accordingly, when the half-height aspect ratio F_AR of the protruding portions 181 range from 0.45 to 0.7, a maximum current efficiency enhancement can be achieved and the light emitting element ED can have a maximum emission efficiency in this case.

On the other hand, in the light emitting display device according to some embodiments of the present disclosure, when the half-height sharpness Rm of the protruding portions 181 is 1, the protruding portions 181 have a triangular shape. When the half-height sharpness Rm of the protruding portions is less than 1, the protruding portions 181 have a semicircular shape. When the half-height sharpness Rm of the protruding portions 181 is greater than 1, the protruding portions 181 have a bell shape. Accordingly, the half-height sharpness Rm of the protruding portions 181 according to the present disclosure ranges from 1.1 to 2.0 such that the maximum tangent slope of the first curved portion 181b is located between the middle area MA and the upper area UA. In this case, when the half-height sharpness Rm of the protruding portions 181 is less than 1.1, the top portions 181a of the protruding portions 181 are not sharp but have a sectional structure of a bell shape or a Gaussian curve, whereby the uplifted portion ELa is not formed in the light emitting layer EL formed on the top portions 181a of the protruding portions 181 and thus an effect based on the uplifted portion ELa cannot be expected. When the half-height sharpness Rm of the protruding portions 181 is greater than 2.0, the width of the upper area UA of the protruding portions 181 is narrow, whereby the top portions 181a of the protruding portions 181 cannot be formed to be sharp and thus an effect based on the uplifted portion ELa cannot be expected.

Figure 13A:
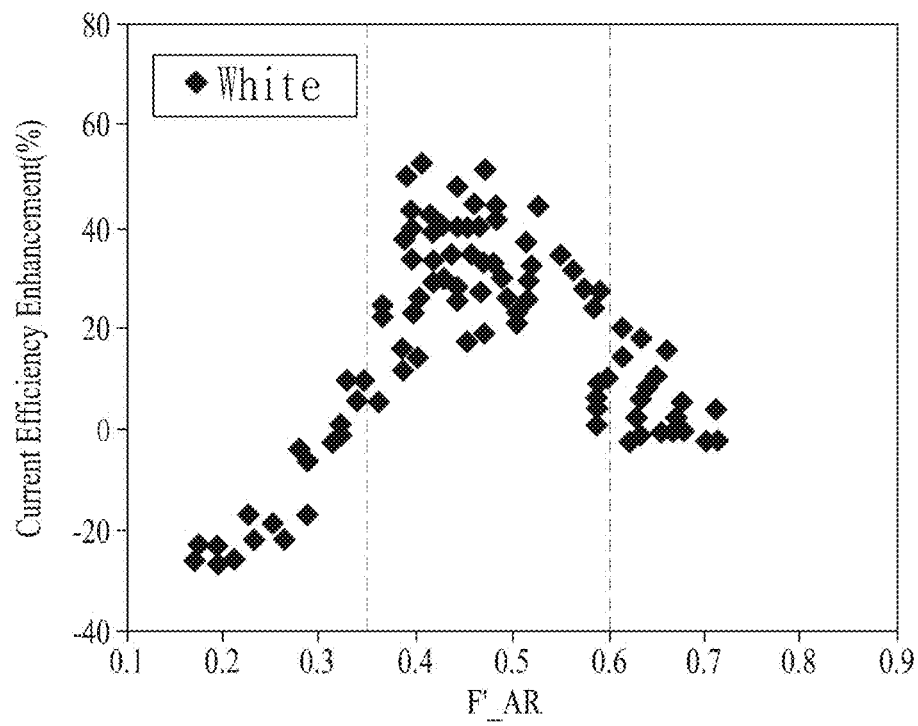
FIG. 13A is a graph illustrating a current efficiency enhancement of a white pixel corresponding to a 4/5-height aspect ratio of a protruding portion in the light emitting display device according to the present disclosure.
Figure 13B:
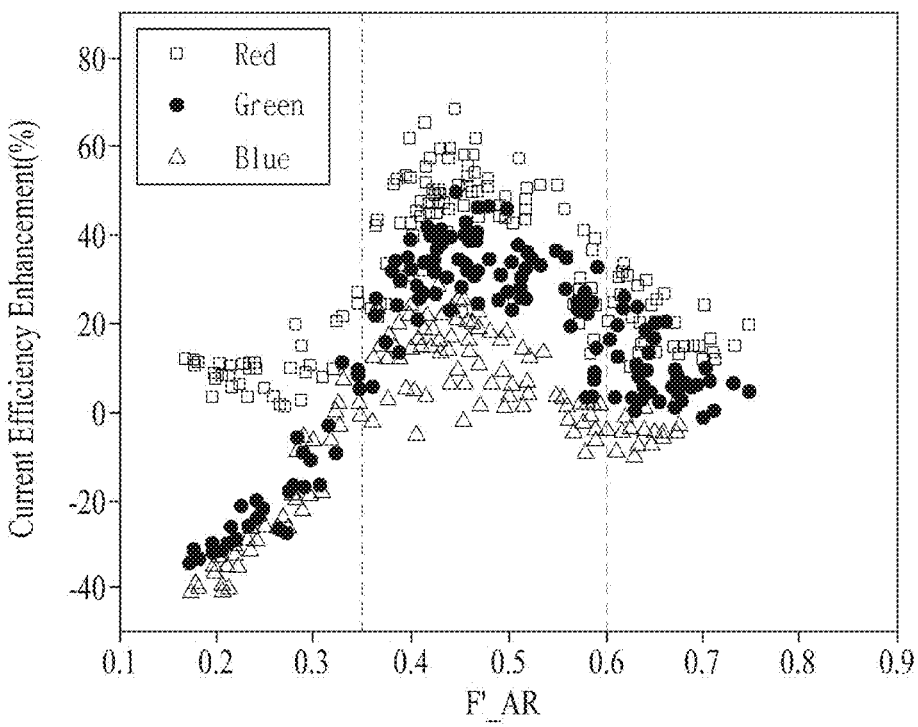
FIG. 13B is a graph illustrating current efficiency enhancements of a red pixel, a green pixel, and a blue pixel corresponding to a 4/5-height aspect ratio of a protruding portion in the light emitting display device according to the present disclosure.

FIG. 13A is a graph illustrating a current efficiency enhancement of a white pixel corresponding to a 4/5-height aspect ratio of a protruding portion in the light emitting display device according to the present disclosure. FIG. 13B is a graph illustrating current efficiency enhancements of a red pixel, a green pixel, and a blue pixel corresponding to a 4/5-height aspect ratio of a protruding portion in the light emitting display device according to the present disclosure.

Referring to FIGS. 13A and 13B along with FIG. 6, when the 4/5-height aspect ratio F'_AR of the protruding portions 181 ranges from 0.35 to 0.6 in each pixel of the light emitting display device according to the present disclosure, it can be seen that the current efficiency enhancement is more excellent (e.g., greater current efficiency enhancement) than cases in which the 4/5-height aspect ratio F'_AR of the protruding portions 181 is less than 0.35 or greater than 0.6. That is, it can be seen that the current efficiency enhancement of the light emitting element ED has a tendency to decrease when the 4/5-height aspect ratio F'_AR of the protruding portions 181 is greater than 0.6 and has a maximum value when the 4/5-height aspect ratio F'_AR of the protruding portions 181 ranges from 0.35 to 0.6.

Accordingly, when the 4/5-height aspect ratio F'_AR of the protruding portions 181 range from 0.35 to 0.6, a maximum current efficiency enhancement can be achieved and the light emitting element ED can have a maximum emission efficiency in this case. For example, when the 4/5-height aspect ratio F'_AR of the protruding portions 181 ranges from 0.4 to 0.5, a white pixel has a maximum current efficiency enhancement of about 50%, a red pixel has a maximum current efficiency enhancement of about 70%, a green pixel has a maximum current efficiency enhancement of about 50%, and a blue pixel has a maximum current efficiency enhancement of about 30%.

As a result, the protruding portions 181 according to some embodiments of the present disclosure have a 4/5-height aspect ratio F'_AR in a range of 0.35 to 0.6 such that the top portions 181a have a sharp apex shape, and have a half-height sharpness Rm in a range of 1.1 to 2.0 such that the effective emission area of the light emitting element ED is located in the upper area of the protruding portions 181. For example, the protruding portions 181 may have a half-height sharpness Rm in a range of 1.1 to 2.0, an aspect ratio AR in a range of 0.35 to 0.65, and a half-height aspect ratio F_AR in a range of 0.45 to 0.7.

Figure 14:
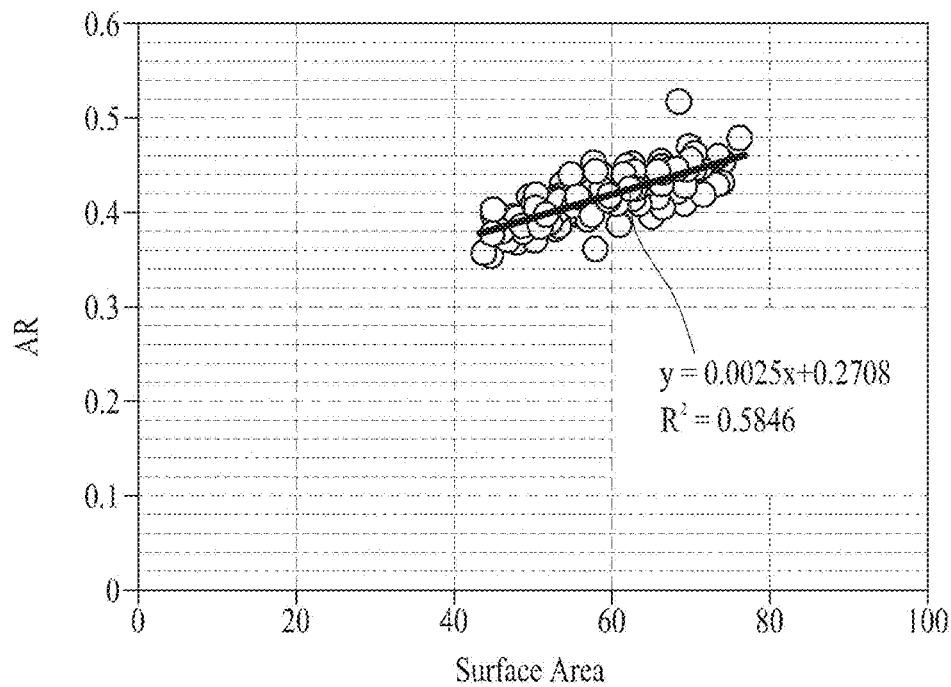
FIG. 14 is a graph illustrating a linear relationship between a surface area of an uneven portion and an aspect ratio of a protruding portion in the light emitting display device according to the present disclosure.

FIG. 14 is a graph illustrating a linear or substantially linear relationship between a surface area of an uneven portion and an aspect ratio of a protruding portion in the light emitting display device according to the present disclosure.

Referring to FIGS. 6, 9, and 14, it can be seen in the light emitting display device according to embodiments of the present disclosure that the aspect ratio AR of the protruding portions 181 increases as the surface area of the uneven portion 180 increases. For example, the aspect ratio AR of the protruding portions 181 ranges from 0.35 to 0.48 depending on the surface area of the uneven portion 180. According to a coefficient of determination $R^2$ based on a quadric function obtained by linear regression analysis of the aspect ratio AR of the protruding portion 181 with respect to the surface area of the uneven portion 180, it can be seen that the aspect ratio AR of the protruding portions 181 with respect to the surface area of the uneven portion 180 has a degree of conformity of about 58%.

Figure 15:
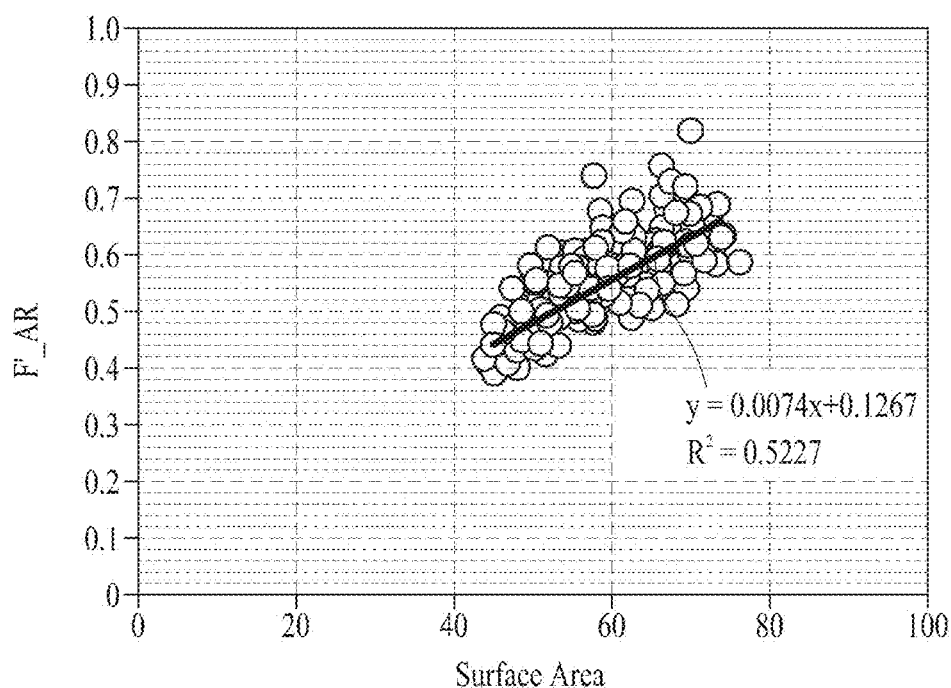
FIG. 15 is a graph illustrating a linear relationship between a surface area of an uneven portion and a 4/5-height aspect ratio of a protruding portion in the light emitting display device according to the present disclosure.

FIG. 15 is a graph illustrating a linear relationship between a surface area of an uneven portion and a 4/5-height aspect ratio of a protruding portion in the light emitting display device according to the present disclosure.

Referring to FIGS. 6, 9, and 15, it can be seen in the light emitting display device according to the present disclosure that the 4/5-height aspect ratio F'_AR of the protruding portions 181 increases as the surface area of the uneven portion 180 increases. For example, the 4/5-height aspect ratio F'_AR of the protruding portions 181 ranges from 0.4 to 0.7 depending on the surface area of the uneven portion 180. According to a coefficient of determination $R^2$ based on a quadric function obtained by linear regression analysis of the 4/5-height aspect ratio F'_AR of the protruding portion 181 with respect to the surface area of the uneven portion 180, it can be seen that the 4/5-height aspect ratio F'_AR of the protruding portions 181 with respect to the surface area of the uneven portion 180 has a degree of conformity of about 52%.

Figure 16A:
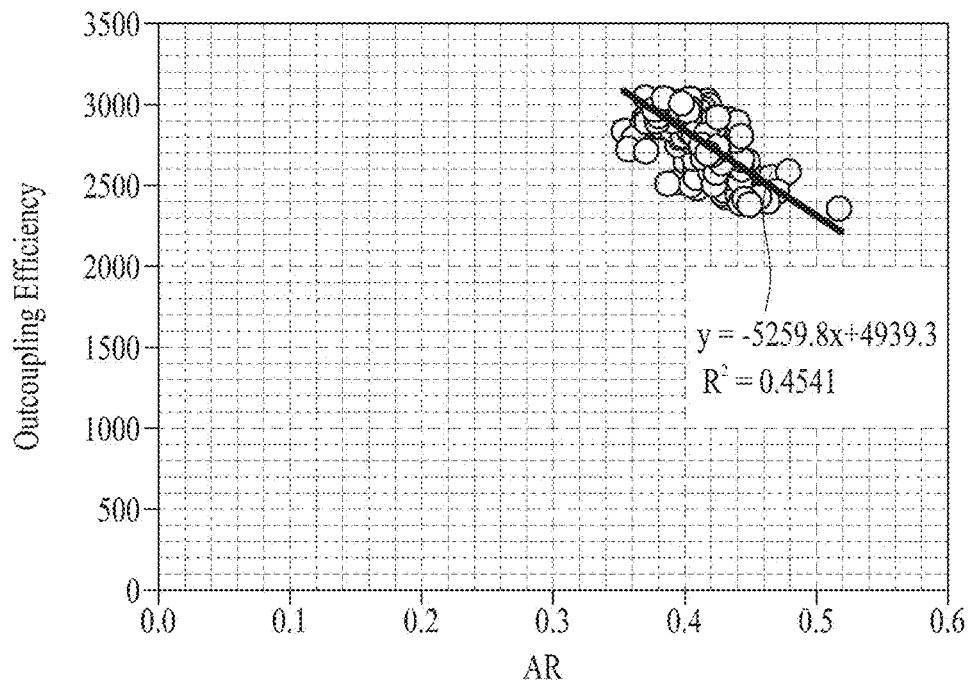
FIG. 16A is a graph illustrating light extraction efficiency corresponding to an aspect ratio of a protruding portion in the light emitting display device according to the present disclosure.
Figure 16B:
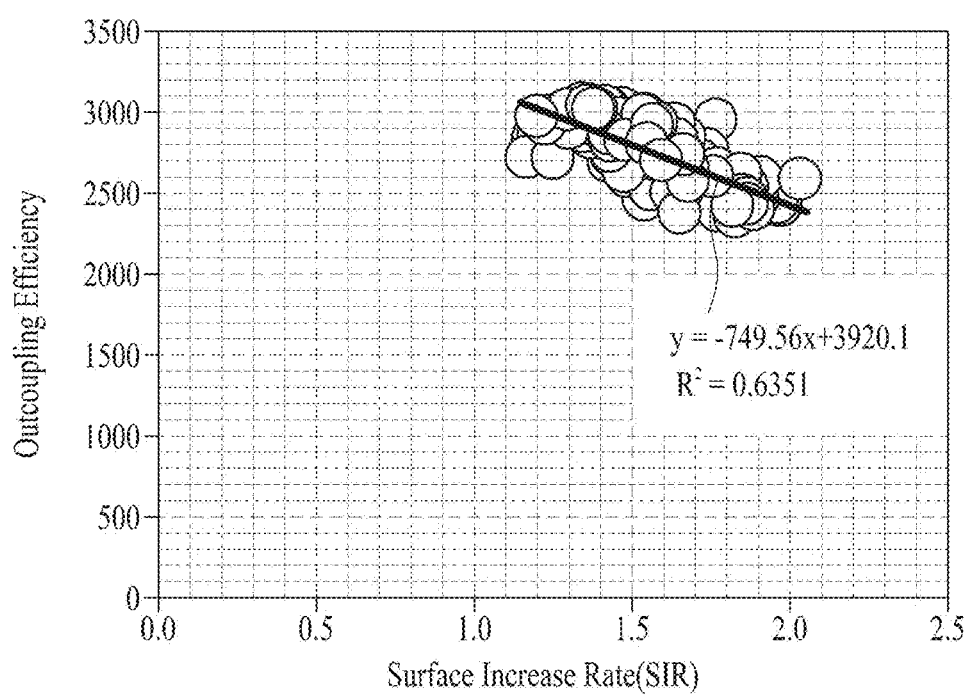
FIG. 16B is a graph illustrating light extraction efficiency corresponding to a surface area increase rate of an uneven portion in the light emitting display device according to the present disclosure.
Figure 16C:
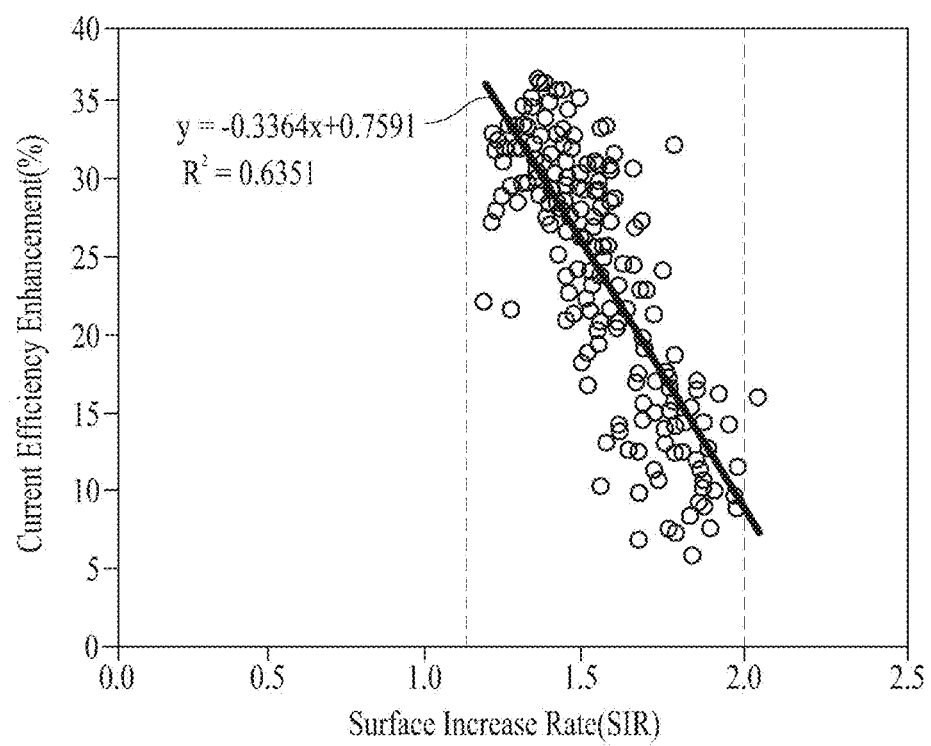
FIG. 16C is a graph illustrating a current efficiency enhancement corresponding to a surface area increase rate of an uneven portion in the light emitting display device according to the present disclosure.

FIG. 16A is a graph illustrating light extraction efficiency corresponding to an aspect ratio of a protruding portion in the light emitting display device according to the present disclosure. FIG. 16B is a graph illustrating light extraction efficiency corresponding to a surface area increase rate of an uneven portion in the light emitting display device according to the present disclosure. FIG. 16C is a graph illustrating a current efficiency enhancement corresponding to a surface area increase rate of an uneven portion in the light emitting display device according to the present disclosure.

Referring to FIGS. 6, 9, and 16A, it can be seen that the light emitting display device according to the present disclosure has light extraction efficiency of about 2400 cd/m² to 3100 cd/m² when the aspect ratio AR of the protruding portions 181 ranges from 0.35 to 0.48. According to a coefficient of determination $R^2$ based on a quadric function obtained by linear regression analysis of the light extraction efficiency with respect to the aspect ratio AR of the protruding portion 181, it can be seen that the light extraction efficiency with respect to the aspect ratio AR of the protruding portions 181 has a degree of conformity of about 45%.

Referring to FIGS. 6, 9, and 16B, it can be seen that the light emitting display device according to the present disclosure has light extraction efficiency of about 2200 cd/m² to 3200 cd/m² when the surface area increase rate SIR of the uneven portion 180 ranges from 1.1 to 2.0. According to a coefficient of determination $R^2$ based on a quadric function obtained by linear regression analysis of the light extraction efficiency with respect to the surface area increase rate SIR of the uneven portion 180, it can be seen that the light extraction efficiency with respect to the surface area increase rate SIR of the uneven portion 180 has a degree of conformity of about 63%.

Referring to FIGS. 6, 9, and 16C, it can be seen that the light emitting display device according to the present disclosure has a current efficiency enhancement of about 5% or more when the surface area increase rate SIR of the uneven portion 180 ranges from 1.1 to 2.0. According to a coefficient of determination $R^2$ based on a quadric function obtained by linear regression analysis of the current efficiency enhancement with respect to the surface area increase rate SIR of the uneven portion 180, it can be seen that the current efficiency enhancement with respect to the surface area increase rate SIR of the uneven portion 180 has a degree of conformity of about 63%.

Figure 17A:
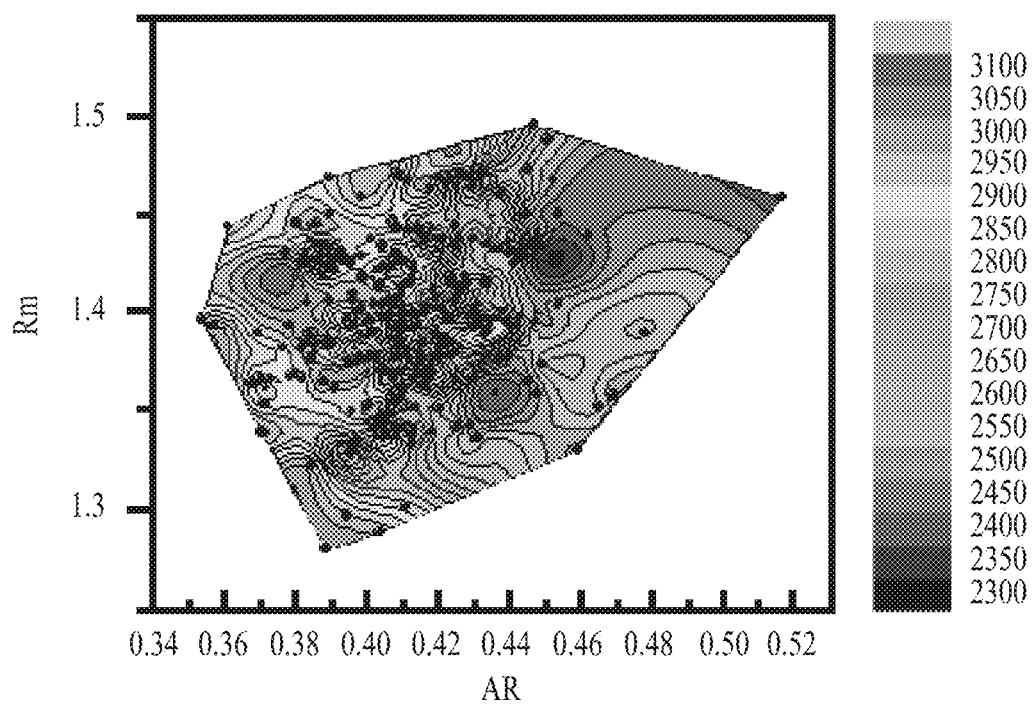
FIG. 17A is a graph illustrating a distribution of light extraction efficiency corresponding to an aspect ratio of a protruding portion and sharpness of a protruding portion in the light emitting display device according to the present disclosure.
Figure 17B:
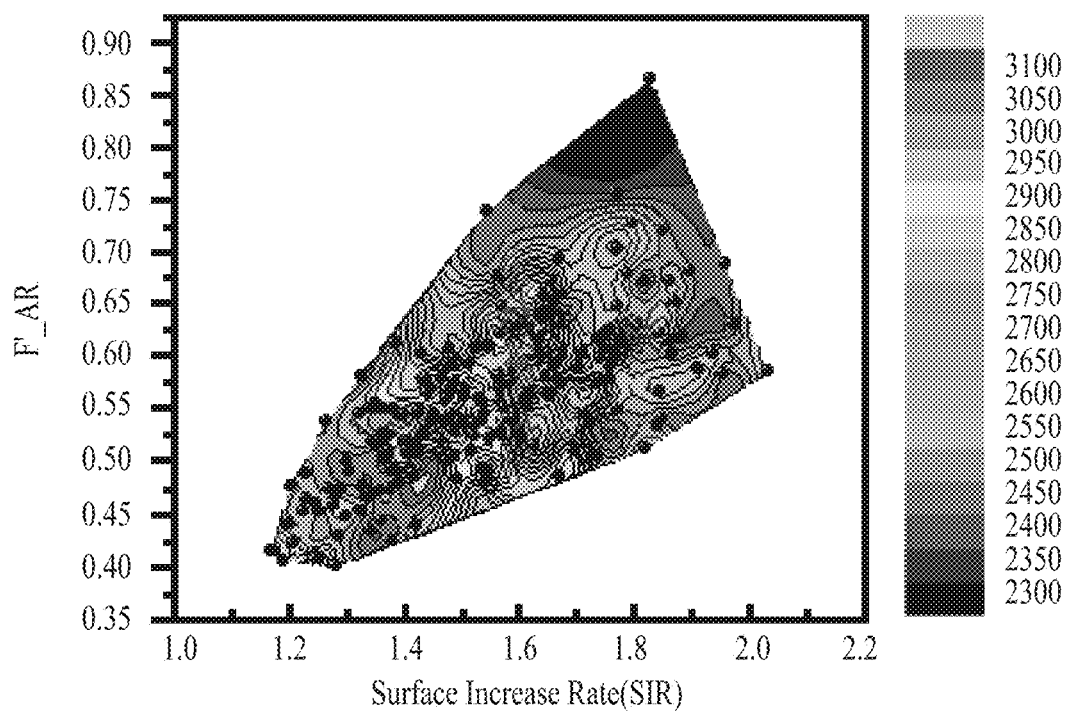
FIG. 17B is a graph illustrating a distribution of light extraction efficiency corresponding to a surface area increase rate of an uneven portion and a 4/5-height aspect ratio of a protruding portion in the light emitting display device according to the present disclosure.

FIG. 17A is a graph illustrating a distribution of light extraction efficiency corresponding to an aspect ratio of a protruding portion and a sharpness of the protruding portion in the light emitting display device according to the present disclosure. FIG. 17B is a graph illustrating a distribution of light extraction efficiency corresponding to a surface area increase rate of the uneven portion and a 4/5-height aspect ratio of the protruding portion in the light emitting display device according to the present disclosure.

Referring to FIGS. 6, 9, and 17A, it can be seen that the light extraction efficiency of the light emitting display device according to the present disclosure has a relatively wide distribution depending on the aspect ratio AR of the protruding portion 181 and the sharpness Rm of the protruding portion 181. For example, when the protruding portion 181 has an aspect ratio AR of 0.38, it can be seen that the light extraction efficiency ranges of 2700 cd/m² to 3100 cd/m² depending on the sharpness Rm of the protruding portion 181. Accordingly, it can be seen that the aspect ratio AR of the protruding portion 181 and the sharpness Rm of the protruding portion 181 cannot satisfactorily represent the light extraction efficiency of the light emitting display device.

Referring to FIGS. 6, 9, and 17B, it can be seen that the light extraction efficiency of the light emitting display device according to the present disclosure has a relatively narrow distribution depending on the surface area increase rate SIR of the uneven portion 180 and the 4/5-height aspect ratio F'_AR of the protruding portion 181. For example, when the surface area increase rate SIR of the uneven portion 180 is 1.35, it can be seen that the light extraction efficiency ranges of 2900 cd/m² to 3100 cd/m² depending on the 4/5-height aspect ratio F'_AR of the protruding portion 181. Particularly, in the light emitting display device according to the present disclosure, when the 4/5-height aspect ratio F'_AR ranges from 0.45 to 0.6, the surface area increase rate SIR of the uneven portion 180 ranges from 1.3 to 1.43, it can be seen that the light extraction efficiency is equal to or greater than 3000 cd/m². Accordingly, it can be seen that the surface area increase rate SIR of the uneven portion 180 and the 4/5-height aspect ratio F'_AR of the protruding portion 181 can satisfactorily represent the light extraction efficiency of the light emitting display device. Accordingly, the surface area increase rate SIR of the uneven portion 180 can serve as an additional factor for determining the emission efficiency, the light extraction efficiency, and the current efficiency enhancement of the light emitting display device. When enhancement in light extraction efficiency of the light emitting display device based on the surface area increase rate SIR of the uneven portion 180 is considered, the surface area increase rate SIR of the uneven portion 180 ranges from 1.05 to 2.0. In this case, the protruding portions 181 may have an aspect ratio AR in a range of 0.35 to 0.48, a half-height aspect ratio F_AR in a range of 0.45 to 0.60, a 4/5-height aspect ratio F'_AR in a range of 0.45 to 0.6, and a half-height sharpness Rm in a range of 1.5 to 2.0.

Figure 18:
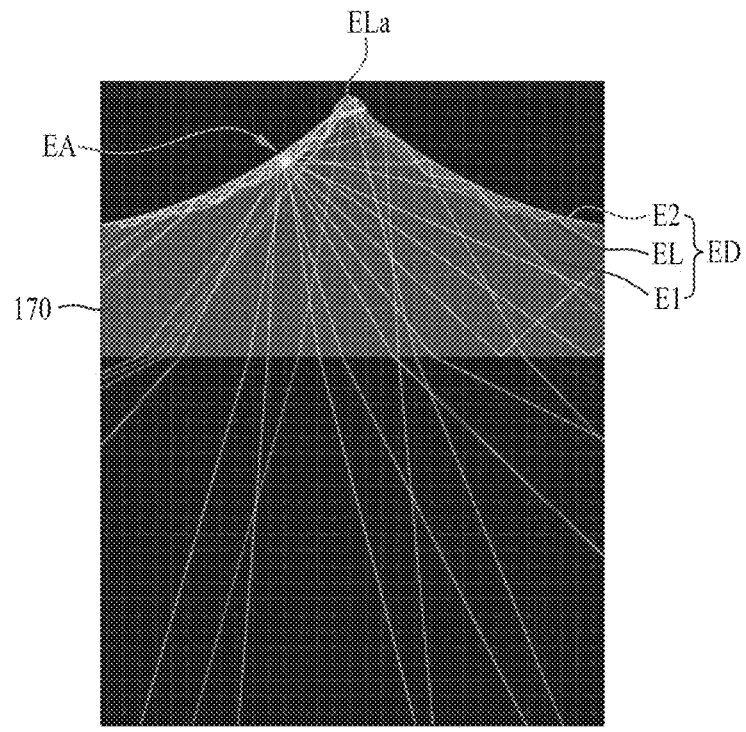
FIG. 18 is a diagram illustrating an optical path corresponding to shapes of a protruding portion and a light emitting layer according to an example of the present disclosure.

FIG. 18 is a simulation diagram illustrating an optical path corresponding to the shapes of a protruding portion and a light emitting layer according to an example of the present disclosure.

Referring to FIG. 18, the top portion of the protruding portion and the top portion of the light emitting layer according to an example of the present disclosure have different shapes (or non-conformal shapes). That is, the top portion of the protruding portion according to the example of the present disclosure has a sharp apex structure (or an apex portion) and the top portion of the light emitting layer has a convex curved shape (or an uplifted portion). In the example of the present disclosure, it can be seen that, since the top portion of the protruding portion and the top portion of the light emitting layer have different shapes, light emitted from the effective emission area EA of the light emitting element ED is totally reflected and propagates to the top portion of the protruding portion in the light emitting element ED, is then reflected by the uplifted portion with a convex curved shape of the light emitting layer, and is extracted to the substrate. That is, it can be seen in the example of the present disclosure that most of light propagating between the top portion of the protruding portion and the uplifted portion of the light emitting layer is extracted to the substrate. Accordingly, since the light emitting display device according to the example of the present disclosure includes a light emitting layer having a contour which does not conform to the contours of the plurality of protruding portions formed in the opening area in each pixel, it is possible to enhance the light extraction efficiency FIG. 19 is a photograph illustrating an actual emission image of pixels in a light emitting display device according to an example of the present disclosure.

Figure 19:
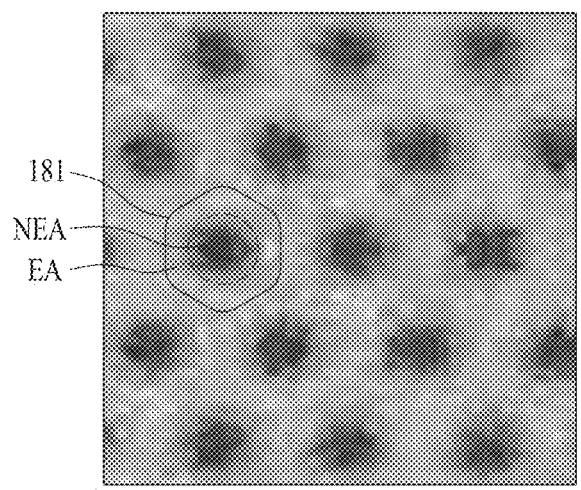
FIG. 19 is a photograph illustrating an actual emission image of pixels in a light emitting display device according to an example of the present disclosure.

As can be seen from FIG. 19, in the light emitting display device according to the example of the present disclosure, a light emitting element includes an effective emission area EA overlapping upper areas of the protruding portions and a non-effective emission area NEA overlapping the lower areas of the protruding portions depending on the shapes of the protruding portions formed in the overcoating layer of the opening area. It can be seen that the effective emission area EA and the non-effective emission area NEA of the light emitting element which is formed on the protruding portions appear in an actual emission image in the same way. Accordingly, in the light emitting display device according to the example of the present disclosure, by setting the 4/5-height aspect ratio of the protruding portions in consideration of the effective emission area of the light emitting element based on the shapes of the protruding portions and setting the half-height sharpness of the protruding portions, it is possible to maximize the emission efficiency of the light emitting element and the light extraction efficiency and to reduce power consumption. In the light emitting display device according to the example of the present disclosure, by setting the surface area increase rate of the uneven portion based on the protruding portions and setting the aspect ratio, the half-height aspect ratio, the 4/5-height aspect ratio, and the sharpness of the protruding portions based on the surface area increase rate, it is possible to maximize the emission efficiency of the light emitting element and the light extraction efficiency and to reduce power consumption.

The light emitting display device according to various embodiments of the present disclosure will be described below.

A light emitting display device according to an example of the present disclosure may include an overcoating layer provided on a substrate and including a plurality of protruding portions, a first electrode provided on the plurality of protruding portions, a light emitting layer provided on the first electrode, and a second electrode provided on the light emitting layer, wherein the first electrode may have contours which conform to the contours of the plurality of protruding portions, and the light emitting layer may have contours which do not conform to the contours of the plurality of protruding portions.

A light emitting display device according to an example of the present disclosure may include a substrate including a plurality of pixels having an opening area, an overcoating layer provided on the substrate and including a plurality of concave portions provided in the opening area and boundary portions provided between the adjacent concave portions, a first electrode provided on the plurality of concave portions and boundary portions, a light emitting layer provided on the first electrode, and a second electrode provided on the light emitting layer, wherein the first electrode may have a contour which conforms to the contours of the plurality of concave portions and the boundary portions, and the light emitting layer may have a contour which does not conform to the contours of the first electrode.

A light emitting display device according to an example of the present disclosure may include a substrate including a plurality of pixels having an opening area, an overcoating layer provided on the substrate and including an uneven portion having a plurality of apex portions provided in the opening area, a first electrode provided on the uneven portion, a light emitting layer provided on the first electrode, and a second electrode provided on the light emitting layer, wherein the first electrode may have a contour which conforms to the contour of the uneven portion, and the light emitting layer may have a contour which does not conforms to the contour of the first electrode.

In an example of the present disclosure, the second electrode may have contours which conform to the contours of the light emitting layer.

In an example of the present disclosure, each of the plurality of protruding portions may include a top portion having a sharp structure and an aspect ratio at a 4/5 of a total height from a bottom portion with respect to the total height between the bottom portion and the top portion may range from 0.35 to 0.6.

In an example of the present disclosure, each of the plurality of protruding portions may have an aspect ratio of 0.35 to 0.65 and a half-height aspect ratio of 0.45 to 0.7 at a half height of the total height from the bottom portion.

In an example of the present disclosure, each of the plurality of protruding portions may include: a top portion having a sharp structure; and a curved portion provided between the top portion and the bottom portion.

In an example of the present disclosure, the curved portion of each of the plurality of protruding portions may include a first tangent slope at a half height of a total height from the bottom portion and a second tangent slope at a 4/5 height with respect to the total height between the bottom portion and the top portion of the protruding portion, and the second tangent slope may be greater than the first tangent slope.

In an example of the present disclosure, the curved portion of each of the plurality of protruding portions may have a maximum tangent slope between a half height position and the top portion of the protruding portion.

In an example of the present disclosure the curved portion of each of the plurality of protruding portions may have a maximum tangent slope at a 4/5 height of a total height from the bottom portion with respect to the total height between the bottom portion and the top portion of the protruding portion.

In an example of the present disclosure, the thickness of the light emitting layer may increase gradually toward the bottom portion of each of the plurality of protruding portions.

In an example of the present disclosure, the light emitting layer may include an effective emission area overlapping an upper area of each of the plurality of protruding portions and a non-effective emission area overlapping a lower area of the protruding portion with respect to the bottom portion of each of the plurality of protruding portions.

In an example of the present disclosure, the light emitting layer may include an uplifted portion overlapping the top portion of each of the plurality of protruding portions, and the uplifted portion may have a convex curved shape to cover the top portion of the corresponding protruding portion.

In an example of the present disclosure, the light emitting layer may include an uplifted portion overlapping the top portion of each of the plurality of protruding portions, and the uplifted portion may have a dome structure having an inflection portion.

In an example of the present disclosure, the light emitting layer may include an uplifted portion overlapping the top portion of each of the plurality of protruding portions, and the uplifted portion may be formed to have a non-conformal shape with respect to the sharp top portion of each of the plurality of protruding portions.

In an example of the present disclosure, the light emitting layer may include an uplifted portion overlapping the top portion of each of the plurality of protruding portions, and the uplifted portion may be formed to serves as a concave lens that reflects light which is emitted from an effective emission area of the light emitting layer and is incident toward the substrate.

In an example of the present disclosure, the first electrode may formed in a conformal shape with respect to the plurality of protruding portions, and the light emitting layer may be formed in a non-conformal shape with respect to the first electrode.

A light emitting display device according to an example of the present disclosure may include an overcoating layer provided on a substrate and including a plurality of protruding portions, a first electrode provided on the plurality of protruding portions, a light emitting layer provided on the first electrode, and a second electrode provided on the light emitting layer, wherein each of the plurality of protruding portions may have a half-height aspect ratio at a half height of the total height from a bottom portion with respect to the total height between the bottom portion and the top portion in a range of 0.45 to 0.7 and an aspect ratio at a 4/5 height of the total height from the bottom portion in a range of 0.35 to 0.6.

In an example of the present disclosure, the aspect ratio of each of the plurality of protruding portion may range from 0.35 to 0.65.

A light emitting display device according to an example of the present disclosure may include an overcoating layer provided on a substrate and including an uneven portion having a plurality of protruding portions, a first electrode provided on the uneven portion, a light emitting layer provided on the first electrode, and a second electrode provided on the light emitting layer, wherein the uneven portion may have a surface area increase rate within a range of 1.05 to 2.0, inclusive, with respect to a unit area.

In an example of the present disclosure, the second electrode may have a surface area increase rate which is lower than the surface area increase rate of the uneven portion with respect to a unit area.

In an example of the present disclosure, the uneven portion may have within a range of 1.3 to 1.43, inclusive, with respect to the unit area.

In an example of the present disclosure, a half-height aspect ratio at a half height of a total height from a bottom portion with respect to the total height between a top portion and the bottom portion in each of the plurality of protruding portions may have within a range from 0.45 to 0.6, inclusive, and a 4/5 height aspect ratio at 4/5 of the total height may have within a range from 0.45 to 0.6, inclusive.

In an example of the present disclosure, an aspect ratio of each of the plurality of protruding portions may have within a range from 0.35 to 0.48, inclusive.

In an example of the present disclosure, each of the plurality of protruding portions may include a top portion that has an apex structure and a curved portion provided between the top portion and the bottom portion, the curved portion of each of the plurality of protruding portions may include a first tangent slope at a half height of a total height from the bottom portion and a second tangent slope at a 4/5 height with respect to the total height between the bottom portion and the top portion of the protruding portion, and the second tangent slope may be greater than the first tangent slope.

In an example of the present disclosure, the second tangent slope may increase gradually toward the top portion from the position of half the total height from the bottom portion.

In an example of the present disclosure, the light emitting layer may include an uplifted portion overlapping a top portion of each of the plurality of protruding portions, and the uplifted portion may include a dome structure having an inflection portion.

In an example of the present disclosure, the light emitting layer may further includes a bank layer defining an opening area which is formed to have a two-dimensional size which is smaller than that of the uneven portion.

A light emitting display device according to an example of the present disclosure may include a substrate that includes a plurality of pixels having an opening area, an overcoating layer provided on the substrate and including an uneven portion having a plurality apex portions provided in the opening area, a first electrode provided on the uneven portion, a light emitting layer provided on the first electrode, and a second electrode provided on the light emitting layer, wherein the first electrode may be formed in a conformal shape with respect to the uneven portion, and the light emitting layer may be formed in a non-conformal shape with respect to the first electrode.

In an example of the present disclosure, the light emitting layer may include an uplifted portion overlapping an apex portion of the uneven portion, and the uplifted portion may have a convex curved shape to cover the apex portion.

In an example of the present disclosure, the apex portions provided in the opening area may have a honeycomb structure two-dimensionally.

In an example of the present disclosure, the uneven portion may have a surface area increase rate of 1.05 to 2.0 with respect to a unit area.

In an example of the present disclosure, the second electrode may be formed in a conformal shape with respect to the light emitting layer, and the second electrode may have a surface area increase rate which is lower than the surface area increase rate of the uneven portion with respect to a unit area.

In an example of the present disclosure, the uneven portion may have a surface area increase rate of 1.3 to 1.43 with respect to a unit area.

In an example of the present disclosure, the light emitting layer may include an uplifted portion overlapping an apex portion of the uneven portion, and the uplifted portion may have a convex curved shape to cover the apex portion.

In an example of the present disclosure, the light emitting layer may include an uplifted portion overlapping the apex portion of the uneven portion, and the uplifted portion may have a convex curved shape to cover the apex portion.

A light emitting display device according to an example of the present disclosure may include an overcoating layer on a substrate and including a plurality of protruding portions, a first electrode on the plurality of protruding portions, a light emitting layer on the first electrode, and a second electrode on the light emitting layer, wherein a half-height aspect ratio at a half height of a total height from a bottom portion with respect to the total height between a top portion and the bottom portion in each of the plurality of protruding portions ranges from 0.45 to 0.7 and an aspect ratio at a 4/5 height of the total height from the bottom portion ranges from 0.35 to 0.6.

A light emitting display device according to an example of the present disclosure may include a substrate including a plurality of pixels having an opening area, an overcoating layer on the substrate and including a plurality of concave portions in the opening area and boundary portions between the adjacent concave portions, a first electrode on the plurality of concave portions and boundary portions, a light emitting layer on the first electrode, and a second electrode on the light emitting layer, wherein the first electrode has a contour which conforms to the contours of the plurality of concave portions and the boundary portions, and the light emitting layer has a contour which does not conform to the contour of the first electrode.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A light emitting display device, comprising:
an overcoating layer on a substrate, the overcoating layer including a plurality of protruding portions;
a first electrode on the plurality of protruding portions;
a light emitting layer on the first electrode; and
a second electrode on the light emitting layer,
wherein the first electrode has a contour which conforms to contours of the plurality of protruding portions,
wherein the light emitting layer has a contour different from the contours of the plurality of protruding portions,
wherein a surface area increase rate of the plurality of protruding portions with respect to a unit area is within a range from 1.05 to 2.0, inclusive, and
wherein the second electrode has a surface area increase rate which is lower than the surface area increase rate of the plurality of protruding portions with respect to the unit area.

2. The light emitting display device according to claim 1, wherein the second electrode has a contour which conforms to the contour of the light emitting layer.

3. The light emitting display device according to claim 1, wherein each of the plurality of protruding portions includes a top portion having a sharp structure and an aspect ratio at 4/5 of a total height from a bottom portion to the top portion is within a range from 0.35 to 0.6, inclusive.

4. The light emitting display device according to claim 3, wherein each of the plurality of protruding portions has an aspect ratio of 0.35 to 0.65 and a half-height aspect ratio within a range of 0.45 to 0.7, inclusive, at a half height of the total height from the bottom portion to the top portion.

5. The light emitting display device according to claim 1, wherein each of the plurality of protruding portions includes:
a top portion having a sharp structure; and
a curved portion provided between the top portion and a bottom portion.

6. The light emitting display device according to claim 5, wherein the curved portion of each of the plurality of protruding portions includes a first tangent slope at a half height of a total height from the bottom portion to the top portion and a second tangent slope at 4/5 of the total height, and
wherein the second tangent slope is greater than the first tangent slope.

7. The light emitting display device according to claim 5, wherein the curved portion of each of the plurality of protruding portions has a maximum tangent slope between a half height position and the top portion of the protruding portion.

8. The light emitting display device according to claim 5, wherein the curved portion of each of the plurality of protruding portions has a maximum tangent slope at 4/5 of a total height from the bottom portion to the top portion of the protruding portion.

9. The light emitting display device according to claim 5, wherein a thickness of the light emitting layer increases gradually toward the bottom portion of each of the plurality of protruding portions.

10. The light emitting display device according to claim 9, wherein the light emitting layer includes an effective emission area overlapping an upper area of each of the plurality of protruding portions and a non-effective emission area overlapping a lower area of each of the plurality of protruding portions.

11. The light emitting display device according to claim 5, wherein the light emitting layer includes an uplifted portion overlapping the top portion of each of the plurality of protruding portions, and
wherein the uplifted portion has a convex curved shape to cover the top portion of the corresponding protruding portion.

12. The light emitting display device according to claim 5, wherein the light emitting layer includes an uplifted portion overlapping the top portion of each of the plurality of protruding portions, and
wherein the uplifted portion has a dome structure having an inflection portion.

13. A light emitting display device, comprising:
an overcoating layer on a substrate, the overcoating layer including an uneven portion having a plurality of protruding portions;
a first electrode on the uneven portion;
a light emitting layer on the first electrode; and
a second electrode on the light emitting layer,
wherein the uneven portion has a surface area increase rate within a range of 1.05 to 2.0, inclusive, with respect to a unit area.

14. The light emitting display device according to claim 13, wherein the second electrode has a surface area increase rate which is lower than the surface area increase rate of the uneven portion with respect to the unit area.

15. The light emitting display device according to claim 13, wherein the surface area increase rate of the uneven portion is within a range of 1.3 to 1.43, inclusive, with respect to the unit area.

16. The light emitting display device according to claim 13, wherein a half-height aspect ratio at a half height of a total height from a bottom portion to a top portion of each of the plurality of protruding portions is within a range from 0.45 to 0.6, inclusive, and wherein a 4/5 height aspect ratio at 4/5 of the total height is within a range from 0.45 to 0.6, inclusive.

17. The light emitting display device according to claim 16, wherein an aspect ratio of each of the plurality of protruding portions is within a range from 0.35 to 0.48, inclusive.

18. The light emitting display device according to claim 13, wherein the light emitting layer includes an uplifted portion overlapping a top portion of each of the plurality of protruding portions, and
wherein the uplifted portion includes a dome structure having an inflection portion.

19. A light emitting display device, comprising:
a substrate including a plurality of pixels having an opening area;
an overcoating layer on the substrate and including an uneven portion having a plurality of apex portions in the opening area;
a first electrode on the uneven portion;
a light emitting layer on the first electrode; and
a second electrode on the light emitting layer,
wherein the uneven portion has a surface area increase rate of 1.05 to 2.0 with respect to a unit area,
wherein the first electrode is formed in a conformal shape with respect to the uneven portion, and
wherein the light emitting layer is formed in a non-conformal shape with respect to the first electrode.

20. The light emitting display device according to claim 19, wherein the second electrode is formed in a conformal shape with respect to the light emitting layer, and
wherein the second electrode has a surface area increase rate which is lower than the surface area increase rate of the uneven portion with respect to the unit area.

21. The light emitting display device according to claim 19, wherein the uneven portion has a surface area increase rate of 1.3 to 1.43 with respect to the unit area.

22. The light emitting display device according to claim 19, wherein the light emitting layer includes an uplifted portion overlapping an apex portion of the uneven portion, and
wherein the uplifted portion has a convex curved shape to cover the apex portion.

* * * * *